(12) United States Patent
Jeong et al.

(10) Patent No.: US 12,400,907 B2
(45) Date of Patent: Aug. 26, 2025

(54) SEMICONDUCTOR DEVICE

(71) Applicant: Samsung Electronics Co., Ltd., Suwon-si (KR)

(72) Inventors: Youncheol Jeong, Hwaseong-si (KR); Jaeung Koo, Seoul (KR); Boun Yoon, Suwon-si (KR); Ilyoung Yoon, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 456 days.

(21) Appl. No.: 17/965,927

(22) Filed: Oct. 14, 2022

(65) Prior Publication Data
US 2023/0253241 A1    Aug. 10, 2023

(30) Foreign Application Priority Data
Feb. 8, 2022    (KR) .................. 10-2022-0016378

(51) Int. Cl.
| | | |
|---|---|---|
| H01L 21/762 | (2006.01) | |
| H01L 23/522 | (2006.01) | |
| H01L 23/528 | (2006.01) | |
| H10D 30/62 | (2025.01) | |
| H10D 84/01 | (2025.01) | |
| H10D 84/03 | (2025.01) | |
| H10D 84/85 | (2025.01) | |

(52) U.S. Cl.
CPC .... *H01L 21/76232* (2013.01); *H01L 23/5226* (2013.01); *H01L 23/5283* (2013.01); *H10D 84/0188* (2025.01); *H10D 84/038* (2025.01); *H10D 84/853* (2025.01); *H10D 30/6211* (2025.01); *H10D 84/0193* (2025.01)

(58) Field of Classification Search
CPC ........... H01L 21/76232; H01L 23/5226; H01L 23/5283
See application file for complete search history.

(56) References Cited

U.S. PATENT DOCUMENTS

| | | |
|---|---|---|
| 9,865,704 B2 | 1/2018 | Xie et al. |
| 10,784,342 B1 | 9/2020 | Hong et al. |
| 11,056,399 B2 | 7/2021 | Yao et al. |
| 11,062,954 B2 | 7/2021 | Hsu et al. |
| 11,121,036 B2 | 9/2021 | Ching et al. |
| 2016/0043170 A1* | 2/2016 | Park .................... H10D 30/797 257/369 |

(Continued)

*Primary Examiner* — Christine A Enad
(74) *Attorney, Agent, or Firm* — Harness, Dickey & Pierce, P.L.C.

(57) ABSTRACT

A semiconductor device may include a substrate including an active pattern extending in a first direction, a gate electrode extending in a second direction and crossing the active pattern, a gate capping pattern covering a top surface of the gate electrode, and a separation structure at a side of the gate electrode and extending in the second direction to penetrate the active pattern in a third direction. The first and second directions are parallel to a bottom surface of the substrate and are perpendicular to the third direction. The separation structure may include a filling pattern, which extends in the third direction to penetrate the active pattern, and a vertical insulating pattern, which is interposed between the filling pattern and the gate electrode. A top surface of the separation structure may be located at a height lower than a top surface of the gate capping pattern.

20 Claims, 33 Drawing Sheets

(56) References Cited

U.S. PATENT DOCUMENTS

| | | | |
|---|---|---|---|
| 2016/0307890 A1* | 10/2016 | Yeo | ................ H10D 30/797 |
| 2019/0057907 A1* | 2/2019 | Jun | ................ H10D 64/017 |
| 2020/0227323 A1 | 7/2020 | Zang et al. | |
| 2021/0118885 A1 | 4/2021 | Park et al. | |
| 2022/0310594 A1 | 9/2022 | Jeong et al. | |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2022-0016378, filed on Feb. 8, 2022, in the Korean Intellectual Property Office, the entire contents of which are hereby incorporated by reference.

BACKGROUND

Various example embodiments relate to a semiconductor device, and in particular, to a semiconductor device including a field effect transistor.

Due to their small-sized, multifunctional, and/or low-cost characteristics, semiconductor devices are being appreciated or esteemed as important elements in the electronics industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet or at least partially meet this demand, structural complexity and/or integration density of semiconductor devices are being increased.

SUMMARY

Some example embodiments provide a semiconductor device with improved reliability.

According to various example embodiments, a semiconductor device may include a substrate including an active pattern, which is extended in a first direction parallel to a bottom surface of the substrate, a gate electrode extended in a second direction and crossing the active pattern, the second direction being parallel to the bottom surface of the substrate and crossing the first direction, a gate capping pattern covering a top surface of the gate electrode, and a separation structure, which is at a side of the gate electrode and extends in the second direction to penetrate the active pattern in a third direction that is perpendicular to the bottom surface of the substrate. The separation structure may include a filling pattern, which extends in the third direction to penetrate the active pattern, and a vertical insulating pattern, which is interposed between the filling pattern and the gate electrode. A top surface of the separation structure may be located at a height lower than a top surface of the gate capping pattern with respect to a top surface of the substrate.

According to various example embodiments, a semiconductor device may include a substrate including an active pattern, which extends in a first direction parallel to a bottom surface of the substrate, a gate electrode extending in a second direction and crossing the active pattern, the second direction parallel to the bottom surface of the substrate and crossing the first direction, a gate capping pattern covering a top surface of the gate electrode, and a separation structure, at a side of the gate electrode and extending in the second direction to penetrate the active pattern in a third direction perpendicular to the bottom surface of the substrate. The gate capping pattern may include a material having a polishing selectivity with respect to the separation structure.

According to various example embodiments, a semiconductor device may include a substrate including an active pattern, which extends in a first direction parallel to a bottom surface of the substrate, a gate electrode extending in a second direction to cross the active pattern, the second direction parallel to the bottom surface of the substrate and crossing the first direction, a gate capping pattern covering a top surface of the gate electrode, a separation structure provided at a side of the gate electrode and extending in the second direction to penetrate the active pattern in a third direction perpendicular to the bottom surface of the substrate, and a separation capping pattern covering a top surface of the separation structure. A first width of the top surface of the separation structure in the first direction may be smaller than a second width of a bottom surface of the separation capping pattern in the first direction.

DETAILED DESCRIPTION

Some example embodiments of inventive concepts will now be described more fully with reference to the accompanying drawings, in which various example embodiments are shown.

Figure 1:
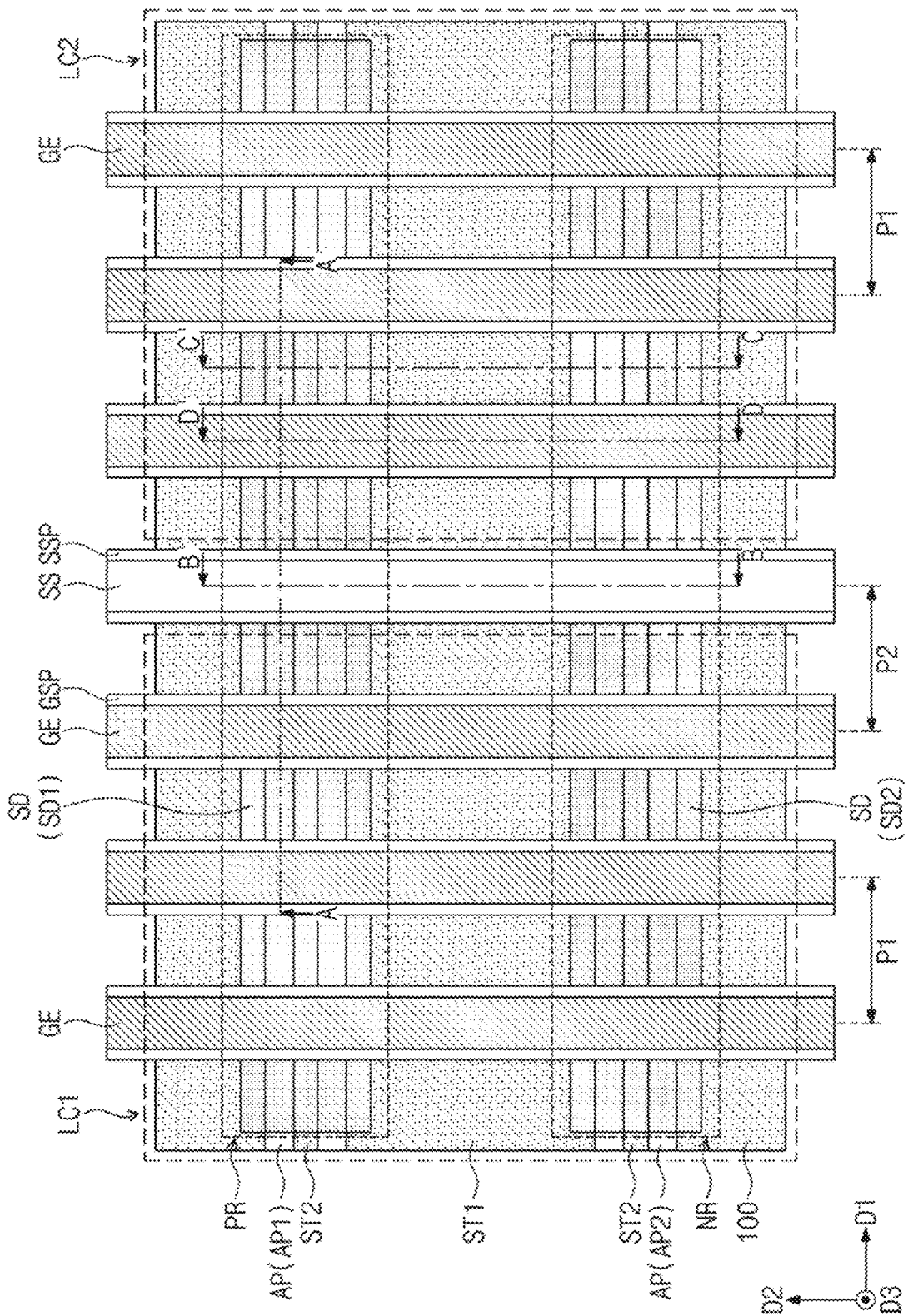
FIG. 1 is a plan view illustrating a semiconductor device according to various example embodiments.

FIG. 1 is a plan view illustrating a semiconductor device according to various example embodiments. FIGS. 2A to 2D are sectional views, which are respectively taken along lines A-A', B-B', C-C', and D-D' of FIG. 1. FIG. 3 is an enlarged sectional view corresponding to a portion Z1 of FIG. 2A.

Referring to FIGS. 1, 2A to 2D, and 3, a first logic cell LC1 and a second logic cell LC2 may be provided on a substrate 100. The substrate 100 may be or may include a semiconductor substrate, which is made of one or more of silicon, germanium, silicon-germanium, or a compound semiconductor material. For example, the substrate 100 may be a silicon wafer or may have been a silicon wafer that has been diced or singulated.

The first and second logic cells LC1 and LC2 may be spaced apart from each other in a first direction D1. The first direction D1 may be parallel to a bottom surface 100b of the substrate 100. Each of the first and second logic cells LC1 and LC2 may constitute at least one of logic circuits (e.g., AND, OR, XOR, XNOR, and inverter circuits). Logic transistors constituting the logic circuit may be disposed on each of the first and second logic cells LC1 and LC2. The first and second logic cells LC1 and LC2 may include the same logic circuit or different logic circuits.

The substrate 100 may include a PMOSFET region PR and an NMOSFET region NR. The PMOSFET and NMOSFET regions PR and NR may be spaced apart from each other in a second direction D2 with a first device isolation layer ST1 interposed therebetween. The second direction D2 may be a direction that is parallel to the bottom surface 100b of the substrate 100 and is not parallel (e.g., orthogonal) to the first direction D1. The first device isolation layer ST1 may be disposed in the substrate 100 and may be extended in the first direction D1. The first device isolation layer ST1 may be formed of or include at least one of insulating materials (e.g., silicon oxide). Each of the PMOSFET and NMOSFET regions PR and NR may extend in the first direction D1. The PMOSFET and NMOSFET regions PR and NR may extend in the first direction D1 to cross the first and second logic cells LC1 and LC2.

Active patterns AP may be provided on the PMOSFET and NMOSFET regions PR and NR and may be extended in the first direction D1. The active patterns AP may include first active patterns AP1 on the PMOSFET region PR and second active patterns AP2 on the NMOSFET region NR. The active patterns AP may be protruding portions of the substrate 100, which extends in a third direction D3. The third direction D3 may be perpendicular to the bottom surface 100b of the substrate 100, and may cross, e.g. be orthogonal to, the first direction D1 and the second direction D2. A second device isolation layer ST2 may be disposed between adjacent ones of the active patterns AP. The second device isolation layer ST2 may be disposed in the substrate 100 and may be extended in the first direction D1. The second device isolation layer ST2 may be formed of or include at least one of insulating materials (e.g., silicon oxide).

Figure 5:
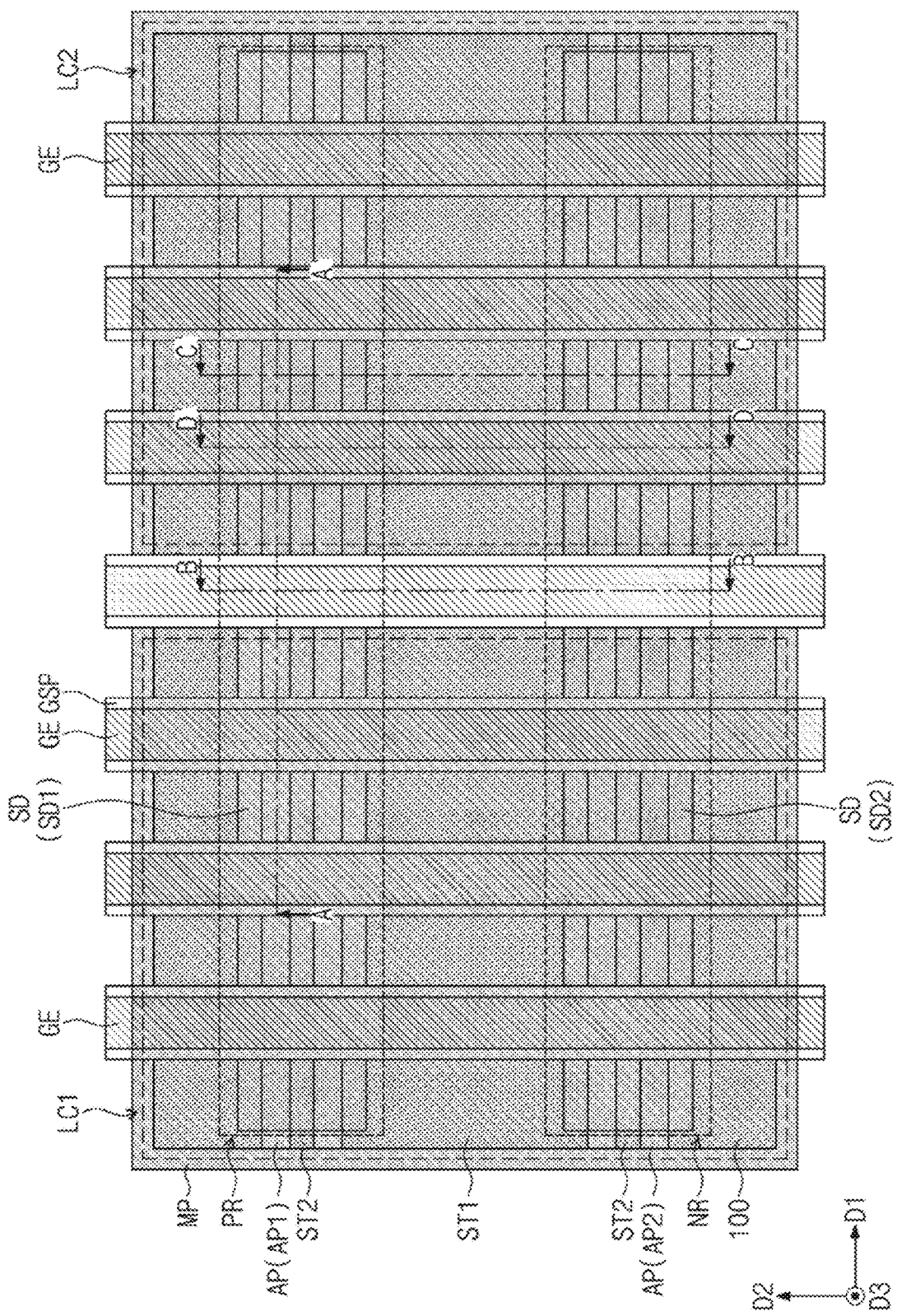
FIGS. 5, 7, 9, and 11 are plan views illustrating a method of fabricating a semiconductor device, according to various example embodiments.
Figure 6A:
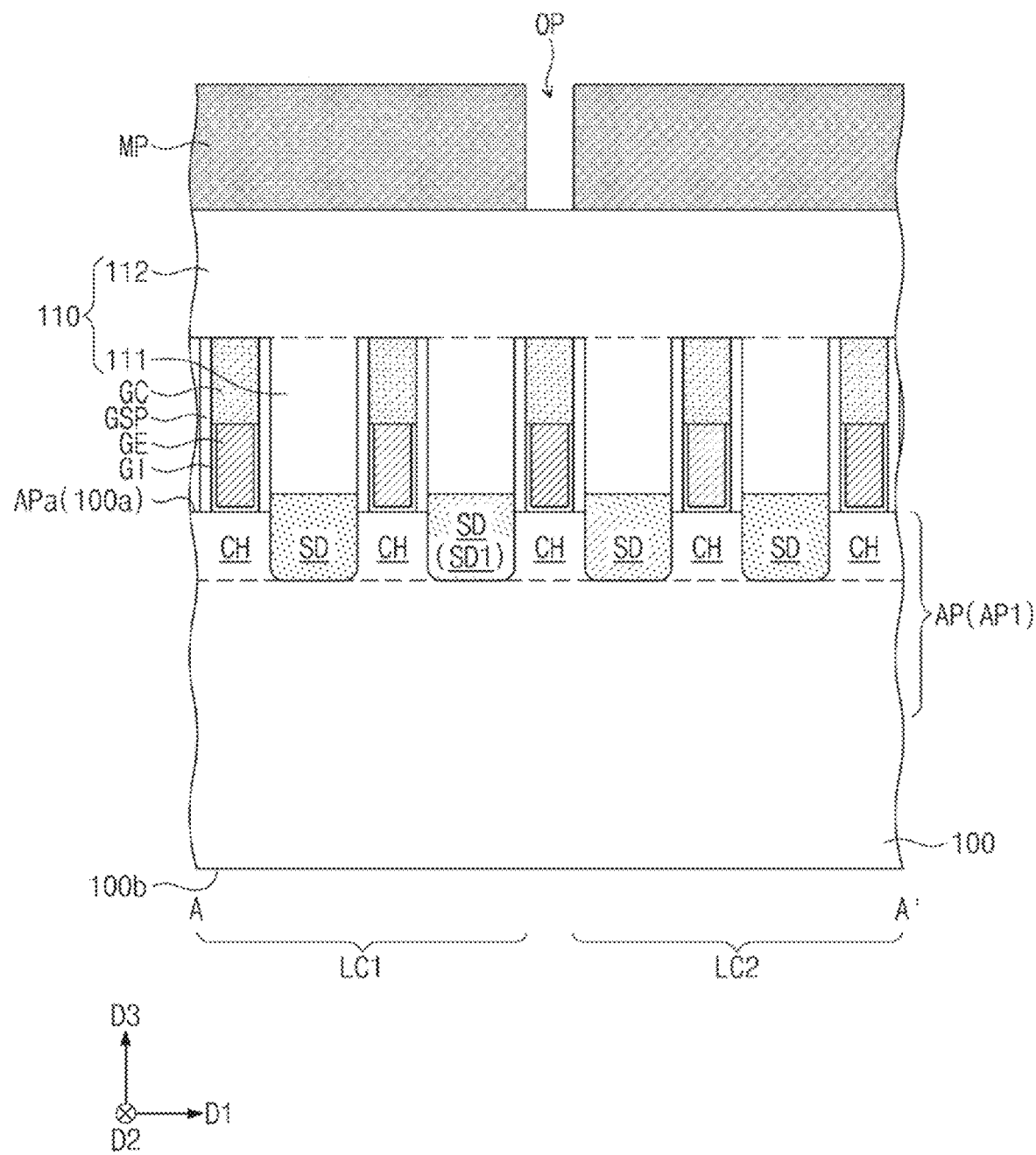
FIGS. 6A to 6D are sectional views, which are respectively taken along lines A-A', B-B', C-C', and D-D' of FIG. 5.
Figure 6B:
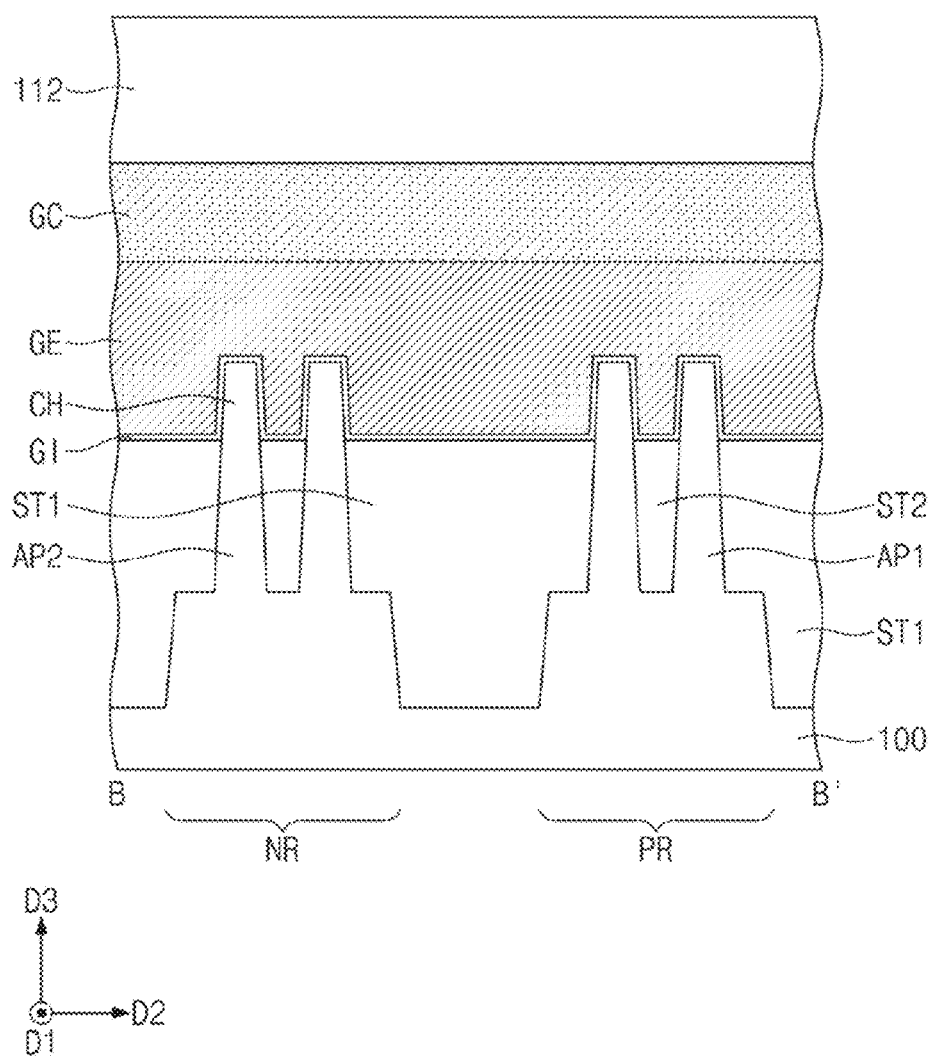
Figure 6C:
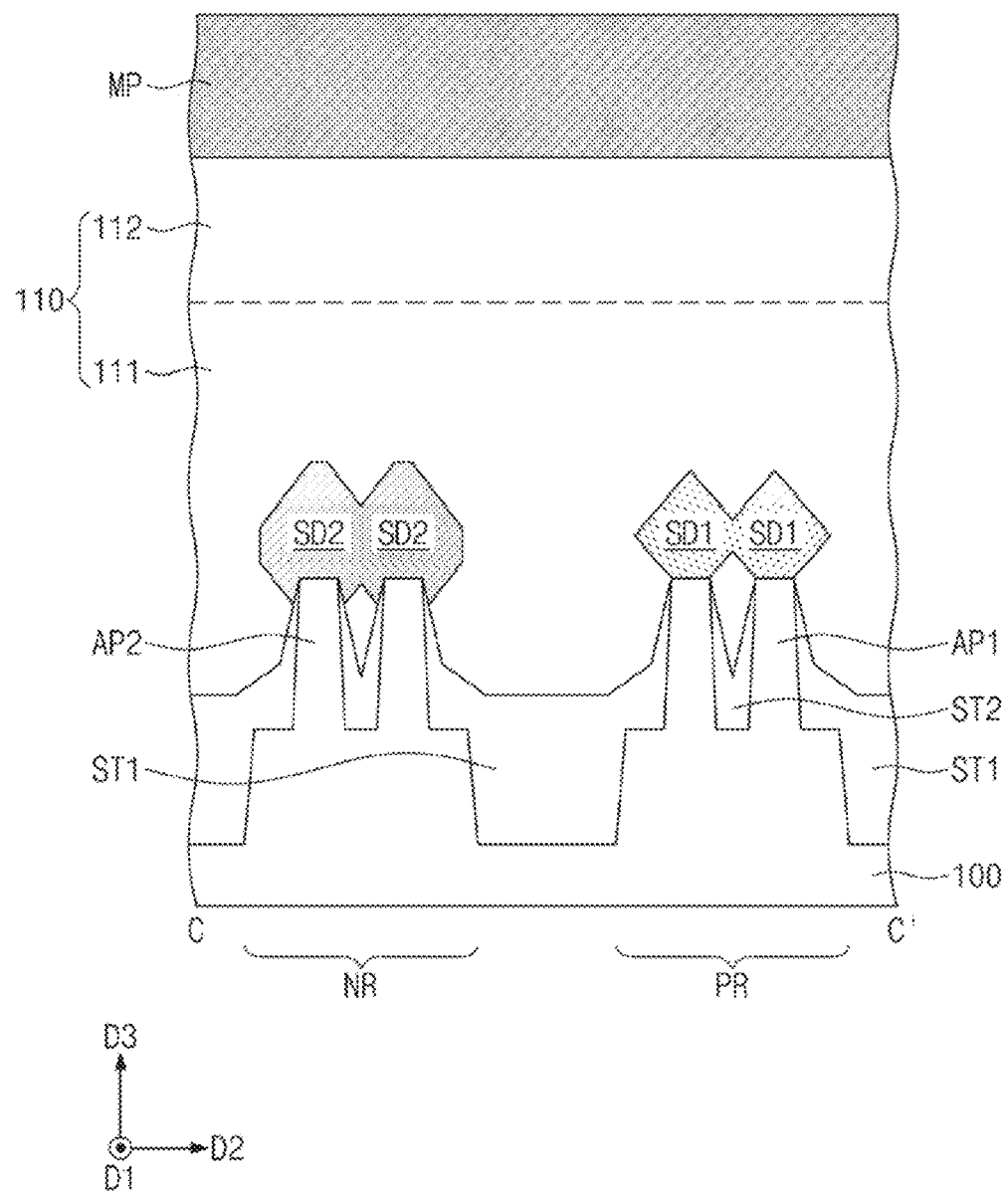
Figure 6D:
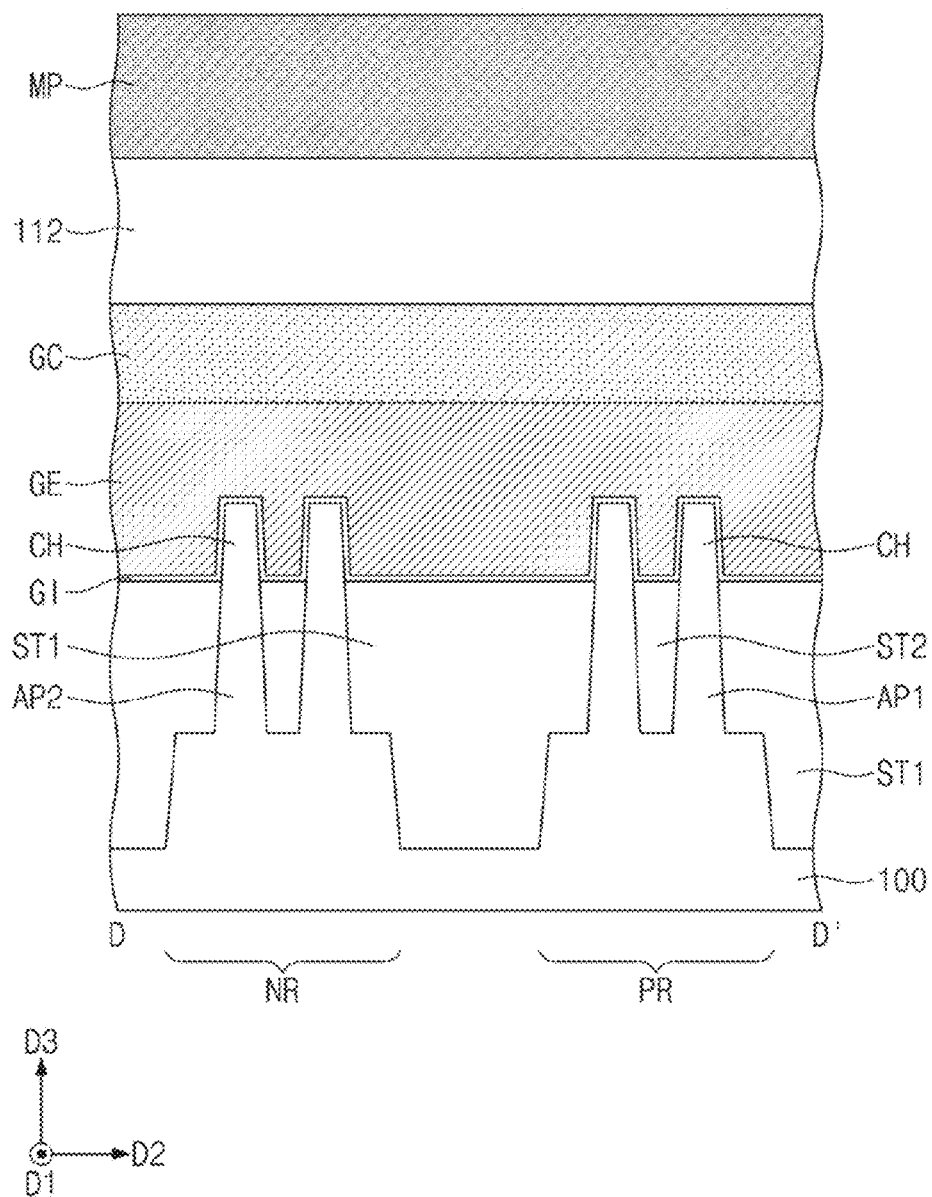

The active patterns AP may include upper portions, which protrude from top surfaces of the first and second device isolation layers ST1 and ST2 in the third direction D3, as shown in FIG. 5. Each of the upper portions of the active patterns AP may have a fin shape. The first and second device isolation layers ST1 and ST2 may not cover the upper portions of the active patterns AP and may cover lower side surfaces of the active patterns AP.

Source/drain patterns SD may be provided on the active patterns AP. The source/drain patterns SD may include first source/drain patterns SD1 on the first active patterns AP1 and second source/drain patterns SD2 on the second active patterns AP2. The first source/drain patterns SD1 may be or include impurity regions of or predominantly of a first conductivity type (e.g., p-type), and the second source/drain patterns SD2 may be or include impurity regions of or predominately of a second conductivity type (e.g., n-type). Channel regions CH may be provided in the upper portions of the active patterns AP, and each of the channel regions CH may be interposed between a pair of the source/drain patterns SD.

The source/drain patterns SD may be epitaxial patterns, which are formed by a selective epitaxial growth (SEG) process such as a homogeneous or heterogenous SEG process. Each of top surfaces of the source/drain patterns SD may be located at a height higher than a top surface of the channel region CH adjacent thereto. The first source/drain patterns SD1 may be formed of or include a semiconductor material (e.g., SiGe) whose lattice constant is larger than a lattice constant of a semiconductor material of the substrate 100. In this case, the first source drain patterns SD1 may exert a compressive stress on the channel region CH adjacent thereto. Alternatively or additionally the second source/drain patterns SD2 may be formed of or include the same semiconductor material (e.g., Si) as the substrate 100.

Gate electrodes GE may be provided on the active patterns AP. The gate electrodes GE may be provided to cross the active patterns AP and may extend in the second direction D2. The gate electrodes GE may be spaced apart from each other in the first direction D1. A pitch between adjacent ones of the gate electrodes GE may be a first pitch P1. As used herein the term "pitch" refers to a distance between centers of two adjacent or neighboring patterns, e.g. of repetitive patterns.

The gate electrodes GE may vertically overlap with the channel regions CH. As shown in FIG. 2D, each of the gate electrodes GE may be provided to face top and side surfaces of each of the channel regions CH, which are vertically stacked. In some example embodiments, the gate electrodes GE may be formed of or include at least one of conductive metal nitride materials (e.g., titanium nitride or tantalum nitride) and/or metallic materials (e.g., titanium, tantalum, tungsten, copper, or aluminum).

A pair of gate spacers GSP may be disposed on opposite side surfaces of each of the gate electrodes GE. The gate spacers GSP may extend along the gate electrodes GE or in the second direction D2. Top surfaces of the gate spacers GSP may be located at a height higher than top surfaces GEa of the gate electrodes GE. The gate spacers GSP may be formed of or include at least one of SiCN, SiCON, or SiN.

Gate dielectric patterns GI may be interposed between the gate electrodes GE and the active patterns AP. Each of the gate dielectric patterns GI may be extended along a bottom surface of each of the gate electrodes GE to cover top and side surfaces of each of the channel regions CH. The gate dielectric patterns GI may be formed of or include a high-k dielectric material. For example, the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Gate capping patterns GC may be provided on the top surfaces GEa of the gate electrodes GE. The gate capping patterns GC may be extended along the gate electrodes GE and in the second direction D2. In some example embodiments, the gate capping patterns GC may be formed of or include at least one of SiON, SiCN, SiCON, or SiN.

An interlayer insulating layer 110 may be provided on the substrate 100. The interlayer insulating layer 110 may cover the source/drain patterns SD and the first and second device isolation layers ST1 and ST2. The interlayer insulating layer 110 may be formed of or include silicon oxide.

Active contacts CT may be provided to penetrate the interlayer insulating layer 110 and may be electrically connected to the source/drain patterns SD. The active contacts CT may be formed of or include at least one of metallic materials (e.g., aluminum, copper, tungsten, molybdenum, and cobalt).

A separation structure SS may be provided along a boundary between the first and second logic cells LC1 and LC2. The separation structure SS may extend in the second direction D2. The separation structure SS may separate adjacent ones of the first and second logic cells LC1 and LC2 from each other and may be provided to cross the PMOSFET and NMOSFET regions PR and NR.

The separation structure SS may be interposed between a pair of the source/drain patterns SD, which are adjacent to each other in the first direction D1. The pair of the source/drain patterns SD may include the source/drain pattern SD of the first logic cell LC1 and the source/drain pattern SD of the second logic cell LC2. The pair of the source/drain patterns SD may be spaced apart from each other by the separation structure SS. The pair of the source/drain patterns SD may be respectively interposed between the separation structure SS and a pair of the gate electrodes GE, which are adjacent to the separation structure SS. The pair of the gate electrodes GE may include the gate electrode GE of the first logic cell LC1 and the gate electrode GE of the second logic cell LC2. The separation structure SS may be interposed between the pair of the gate electrodes GE. A pitch between the separation structure SS and the gate electrode GE adjacent thereto (i.e., one of the pair of the gate electrodes GE) may be a second pitch P2. The second pitch P2 may be substantially equal to the first pitch P1.

On the PMOSFET region PR, the separation structure SS may extend in the second direction D2 to cross upper portions of the first active patterns AP1. The first active pattern AP1 of the first logic cell LC1 and the first active pattern AP1 of the second logic cell LC2 may be electrically separated from each other by the separation structure SS. On the NMOSFET region NR, the separation structure SS may extend in the second direction D2 to cross upper portions of the second active patterns AP2. The second active pattern AP2 of the first logic cell LC1 and the second active pattern AP2 of the second logic cell LC2 may be electrically separated from each other by the separation structure SS.

First lower recesses LR1 may be provided in upper portions of the active patterns AP, and second lower recesses LR2 may be provided in upper portions of the first and second device isolation layers ST1 and ST2. The first lower recesses LR1 may be deeper than the second lower recesses LR2. The separation structure SS may fill the first lower recesses LR1 and the second lower recesses LR2. For example, the separation structure SS may be provided to penetrate the upper portions of the active patterns AP and the upper portions of the first and second device isolation layers ST1 and ST2 in the third direction D3. For example, as shown in FIG. 2B, the separation structure SS filling the first lower recesses LR1 may have a bottom surface SSb that is located at a height higher than a bottom surface ST2b of the second device isolation layer ST2. Alternatively, although not shown, the bottom surface SSb of the separation structure SS may be located at a height lower than the bottom surface ST2b of the second device isolation layer ST2.

A side surface of the separation structure SS may have a profile, which protrudes in the first direction D1, at a level lower than top surfaces APa of the active patterns AP (i.e., a top surface 100a of the substrate 100). As an example, a portion of the side surface of the separation structure SS may protrude toward the pair of the source/drain patterns SD, at a level lower than the top surfaces APa of the active patterns AP. A top surface SSa of the separation structure SS may have a first width W1 in the first direction D1, and the protruding portion of the separation structure SS may have a third width W3 in the first direction D1. The first width W1 may be smaller than or substantially equal to the third width W3.

Separation spacers SSP may be provided on opposite side surfaces of the separation structure SS. The separation spacers SSP may be interposed between the opposite side surfaces of the separation structure SS and side surfaces of the pair of the source/drain patterns SD and may be extended to cover side surfaces of the active contacts CT. Top surfaces of the separation spacers SSP may be coplanar with the top surface SSa of the separation structure SS. The separation spacers SSP may be formed of or include the same material as the gate spacers GSP. In various example embodiments, the separation spacers SSP may be formed of or include at least one of SiCN, SiCON, or SiN. A width of each of the separation spacers SSP may be smaller than or substantially equal to a width of each of the gate spacers GSP, when measured in the first direction D1.

The separation structure SS may include a filling pattern FP, which is provided to penetrate the active patterns AP in the third direction D3, and a vertical insulating pattern VI, which is interposed between the filling pattern FP and the separation spacers SSP. The vertical insulating pattern VI may be provided to conformally cover an inner surface of each of the first and second lower recesses LR1 and LR2. The vertical insulating pattern VI may be interposed between the filling pattern FP and the active patterns AP and between the filling pattern FP and the first and second device isolation layers ST1 and ST2.

The filling pattern FP and the vertical insulating pattern VI may be formed of or include different materials, e.g. may not include the same material. For example, the vertical insulating pattern VI may be formed of or include a material whose dielectric constant is lower than that of the filling pattern FP. In some example embodiments, the filling pattern FP may be formed of or include silicon oxide and may not include silicon carbon oxide, and the vertical insulating pattern VI may be formed of or include silicon carbon oxide (SiOC) whose dielectric constant is lower than that of the silicon oxide, and may not include silicon oxide. At least one of the filling pattern FP and the vertical insulating pattern VI may be formed of or include a material whose dielectric constant is lower than the gate capping patterns GC.

The gate capping patterns GC may be formed of or include a material that is chosen to have polishing selectivity with respect to the separation structure SS. The gate capping patterns GC may be formed of or include a material that is chosen to have polishing selectivity (e.g. that polishes slower) with respect to at least one of the filling pattern FP and the vertical insulating pattern VI. As an example, the separation structure SS may be formed of or include at least one of silicon carbon oxide or silicon oxide (e.g., the filling pattern FP and the vertical insulating pattern VI include silicon oxide and silicon carbon oxide, respectively), the gate capping patterns GC may be formed of or include a material (e.g., silicon nitride) having polishing selectivity (e.g. polishes slower in a chemical mechanical planarization (CMP) process) with respect thereto.

The separation structure SS may be formed of or include the same material as the interlayer insulating layer 110. For example, both of the filling pattern FP and the interlayer insulating layer 110 may be formed of or include silicon oxide. The gate capping patterns GC may be formed of or include a material having polishing selectivity with respect to the interlayer insulating layer 110.

The top surface SSa of the separation structure SS may be located at a height lower than top surfaces GCa of the gate capping patterns GC. A top surface FPa of the filling pattern FP and a top surface VIa of the vertical insulating pattern VI may be located at a height lower than the top surfaces GCa of the gate capping patterns GC. The top surfaces SSPa of the separation spacers SSP may be located at a height lower than the top surfaces GCa of the gate capping patterns GC.

A separation capping pattern SC may be provided on the top surface SSa of the separation structure SS. The separation capping pattern SC may cover the top surface SSa of the separation structure SS (e.g., the top surface FPa of the filling pattern FP and the top surface VIa of the vertical insulating pattern VI) and may extend to cover the top surfaces of the separation spacers SSP. A bottom surface SCb of the separation capping pattern SC may have a second width W2, when measured in the first direction D1. The second width W2 may be larger than the first width W1. A top surface of the separation capping pattern SC may have a fourth width W4, when measured in the first direction D1. The second width W2 may be greater than the fourth width W4. The top surface of the separation capping pattern SC is illustrated to be located at substantially the same height as the top surfaces of the active contacts CT, but inventive concepts are not limited to this example. The separation structure SS may be formed of or include the same material as the separation capping pattern SC. For example, at least one of the filling pattern FP and the vertical insulating pattern VI may be formed of or include the same material as the separation capping pattern SC. In some example embodiments, the separation capping pattern SC may be formed of or include silicon oxide, and at least one of the filling pattern FP and the vertical insulating pattern VI may be formed of or include silicon oxide.

Although not shown, a plurality of interconnection layers may be provided on the gate capping patterns GC, the active contacts CT, and the separation capping pattern SC. The interconnection layers may constitute the logic circuit of the first and second logic cells LC1 and LC2. The interconnection layers may be provided to electrically connect the first and second logic cells LC1 and LC2 to another logic cell.

According to various example embodiments, the filling pattern FP and the vertical insulating pattern VI may be formed of or include at least one of insulating materials having low dielectric constants. Accordingly, it may be possible to reduce an electric interference issue from occurring between the first and second logic cells LC1 and LC2, which are adjacent to each other, and/or to improve reliability of the semiconductor device.

Figure 2A:
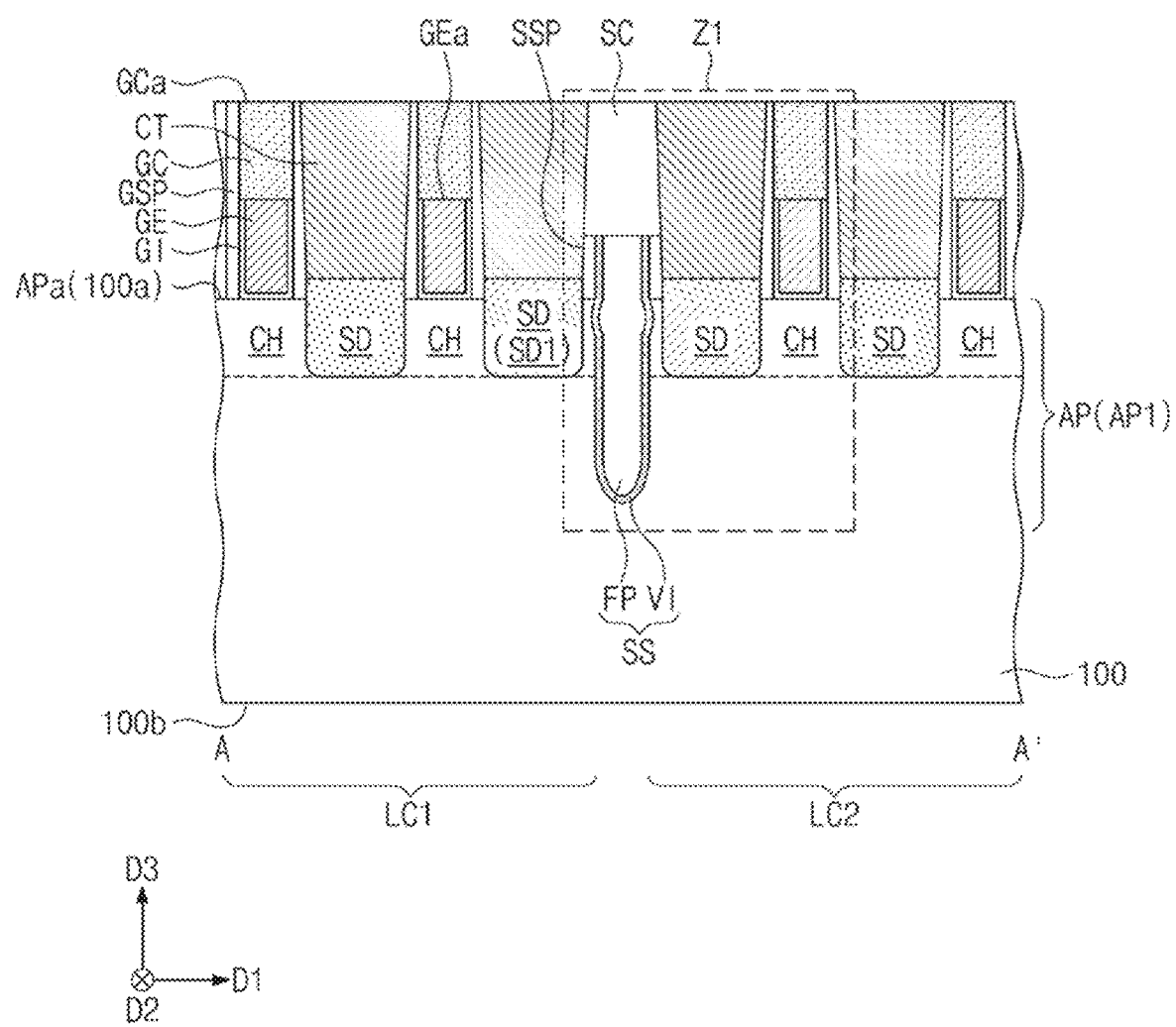
FIGS. 2A to 2D are sectional views, which are respectively taken along lines A-A', B-B', C-C', and D-D' of FIG. 1.
Figure 2B:
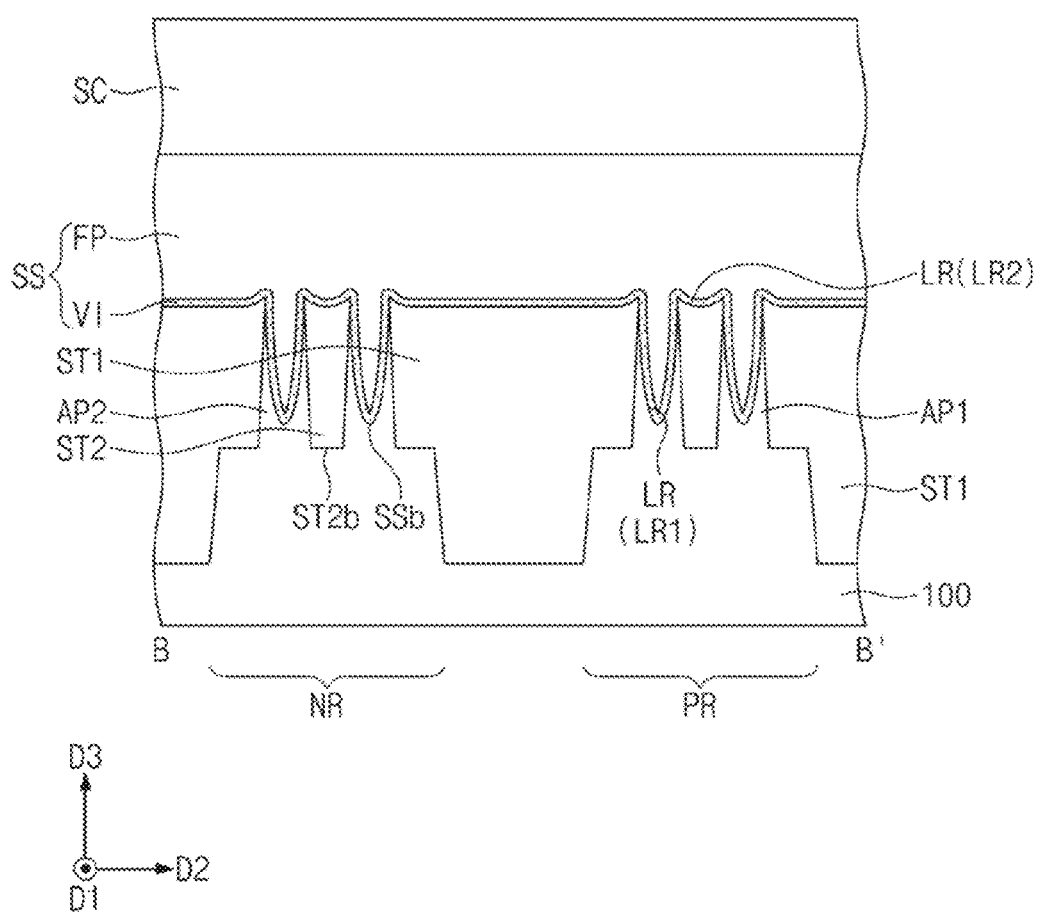
Figure 2C:
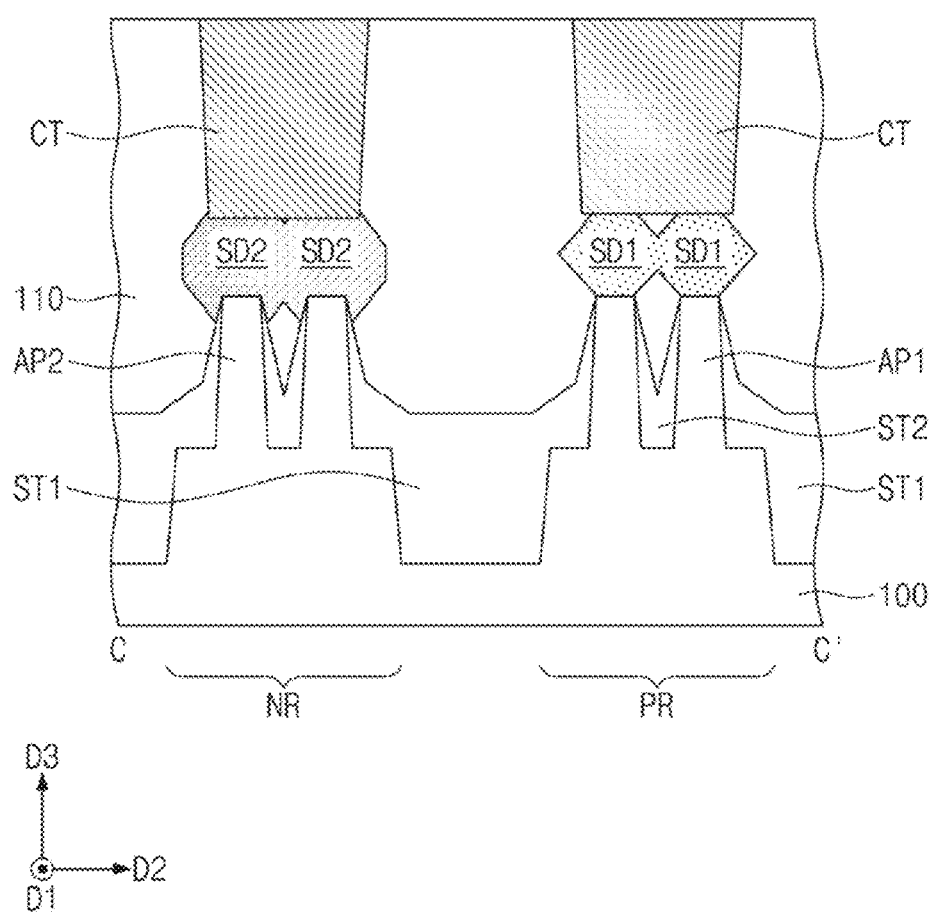
Figure 2D:
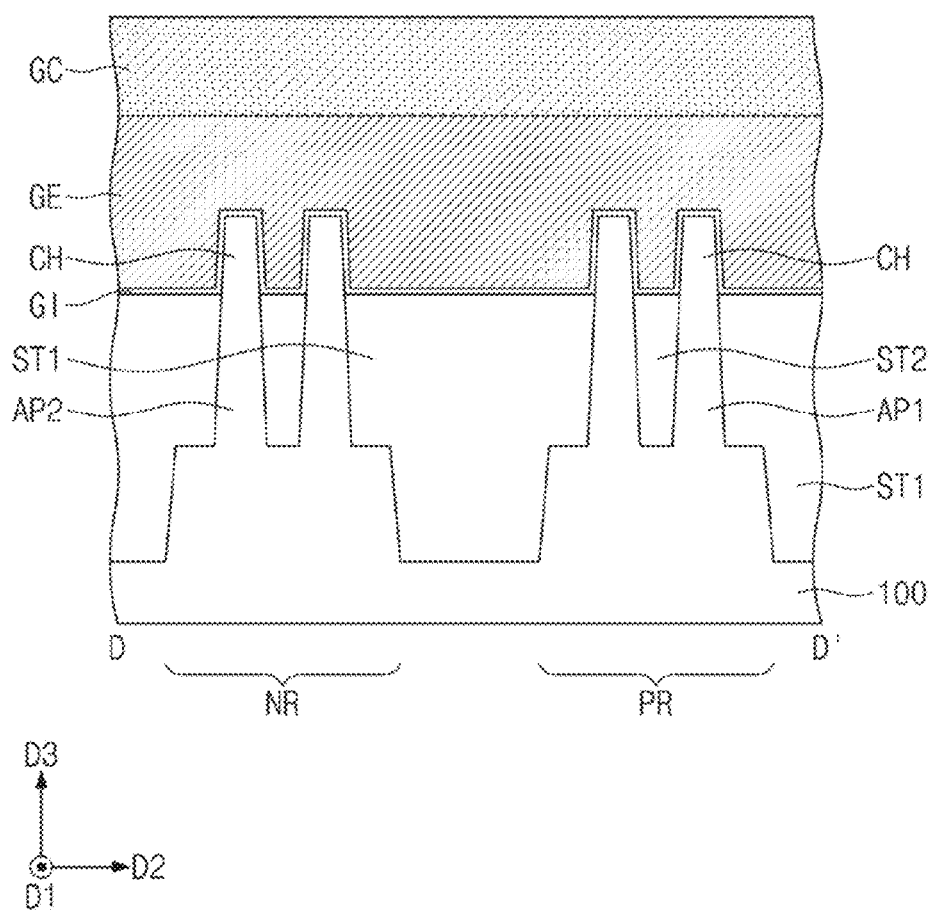
Figure 3:
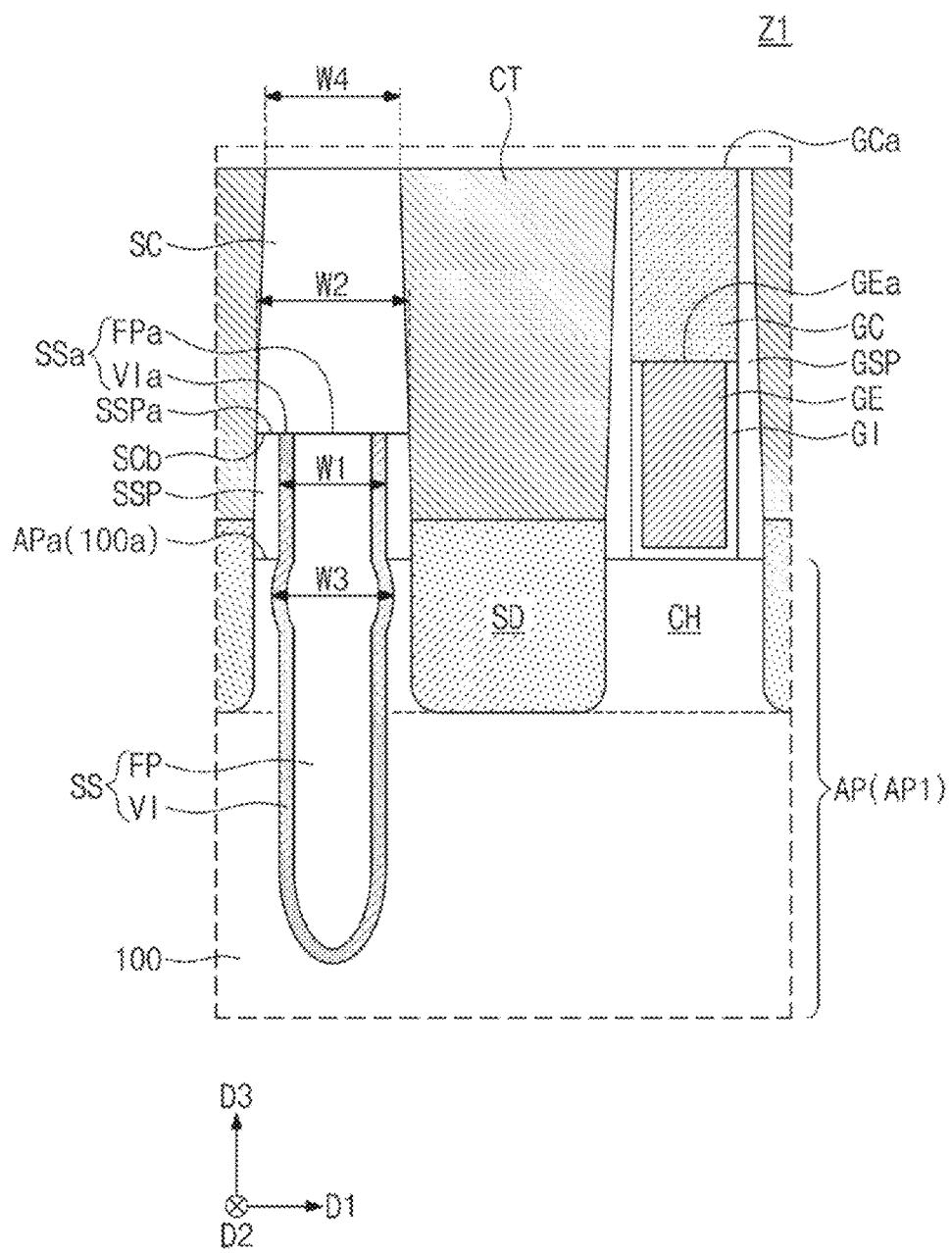
FIGS. 3 and 4 are enlarged sectional views, each of which corresponds to a portion Z1 of FIG. 2A.
Figure 4:
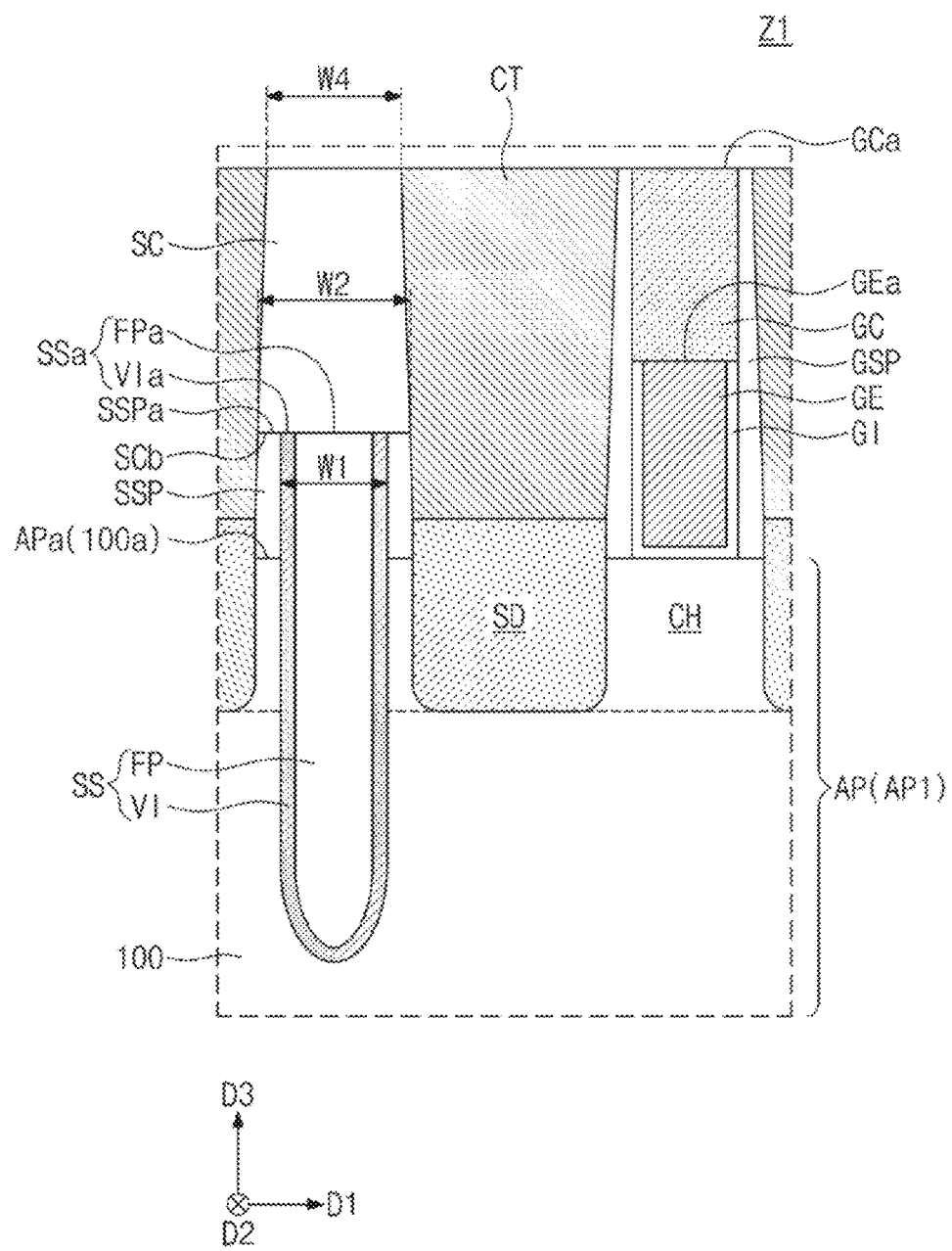

FIG. 4 is an enlarged sectional view corresponding to the portion Z1 of FIG. 2A. For concise description, a previously described element may be identified by the same reference number without repeating an overlapping description thereof.

Referring to FIGS. 2A and 4, the separation structure SS may be provided to penetrate the upper portions of the active patterns AP in the third direction D3. The separation structure SS may be provided in the upper portions of the active patterns AP to be linearly extended in the third direction D3. For example, the side surface of the separation structure SS may have a flat shape, at a level lower than the top surfaces APa of the active patterns AP (e.g., the top surface 100a of the substrate 100). The side surface of the separation structure SS may not protrude toward the pair of the source/drain patterns SD, at a level lower than the top surfaces APa of the active patterns AP.

FIGS. 5, 7, 9, and 11 are plan views illustrating a method of fabricating a semiconductor device, according to various example embodiments. FIGS. 6A to 6D are sectional views, which are respectively taken along lines A-A', B-B', C-C', and D-D' of FIG. 5. FIGS. 8A to 8D are sectional views, which are respectively taken along lines A-A', B-B', C-C', and D-D' of FIG. 7. FIGS. 10A to 10D are sectional views, which are respectively taken along lines A-A', B-B', C-C', and D-D' of FIG. 9. FIGS. 12A to 12D are sectional views, which are respectively taken along lines A-A', B-B', C-C', and D-D' of FIG. 11. The fabricating method will be described in more detail below. For concise description, a previously described element may be identified by the same reference number without repeating an overlapping description thereof.

Referring to FIGS. 5 and 6A to 6D, the active patterns AP may be formed by patterning an upper portion of the substrate 100. The active patterns AP may be extended in the first direction D1 and may include the first active patterns AP1 and the second active patterns AP2. The first active patterns AP1 may be formed on the PMOSFET region PR of the substrate 100, and the second active patterns AP2 may be formed on the NMOSFET region NR of the substrate 100.

A trench region may be formed between the active patterns AP, and the first and second device isolation layers ST1 and ST2 may be formed to fill the trench region. The first device isolation layer ST1 may be formed between the PMOSFET and NMOSFET regions PR and NR to separate the PMOSFET and NMOSFET regions PR and NR from each other in the second direction D2. The second device isolation layer ST2 may be provided to separate adjacent ones of the first active patterns AP1 from each other and to separate adjacent ones of the second active patterns AP2 from each other.

The source/drain patterns SD may be formed to partially cover the active patterns AP. The source/drain patterns SD may include first source/drain patterns SD1 on the first active patterns AP1 and second source/drain patterns SD2 on the second active patterns AP2. The gate electrodes GE may be formed to cross the active patterns AP in the second direction D2.

In detail, sacrificial patterns (not shown) may be formed to cross the active patterns AP in the second direction D2. The formation of the sacrificial patterns may include forming a sacrificial layer on the substrate 100 and patterning the sacrificial layer. The sacrificial patterns may be formed of or include poly silicon.

A pair of the gate spacers GSP may be formed on opposite side surfaces of each of the sacrificial patterns. The gate spacers GSP may be formed of or include at least one of SiCN, SiCON, or SiN.

The source/drain patterns SD may be formed on the active patterns AP. When viewed in a plan view, a pair of the source/drain patterns SD may be formed on opposite side surfaces of each of the sacrificial patterns. The formation of the source/drain patterns SD may include etching the upper portions of the active patterns AP to form recesses exposing side surfaces of the active patterns AP and performing a selective epitaxial growth process, in which the exposed side surfaces of the active patterns AP are used as a seed layer, to form the source/drain patterns SD. Accordingly, each of the channel regions CH may be interposed between the pair of the source/drain patterns SD and may be disposed below each of the sacrificial patterns.

The selective epitaxial growth process may include a chemical vapor deposition (CVD) process and/or a molecular beam epitaxy (MBE) process. In some example embodiments, impurities may be injected into the source/drain patterns SD in an in-situ manner during the selective epitaxial growth process. Alternatively or additionally, the impurities may be injected or implanted into the source/drain patterns SD, after the formation of the source/drain patterns SD. The first source/drain patterns SD1 and the second source/drain patterns SD2 may be sequentially formed through different processes. For example, the first source/drain patterns SD1 and the second source/drain patterns SD2 may not be formed at the same time; the first source/drain pattern SD1 may be formed before, or after, the second source/drain pattern SD2.

A first interlayer insulating layer 111 may be formed to cover the sacrificial patterns, the gate spacers GSP, and the source/drain patterns SD. A planarization process (e.g., etch-back process and/or a polishing (CMP) process) may be performed on the first interlayer insulating layer 111 to expose top surfaces of the sacrificial patterns. The first interlayer insulating layer 111 may be formed of or include silicon oxide.

The exposed sacrificial patterns may be replaced with the gate dielectric patterns GI, the gate electrodes GE, and the gate capping patterns GC. In detail, empty spaces may be formed by selectively removing the exposed sacrificial patterns. The gate dielectric pattern GI, the gate electrode GE, and a gate capping pattern GP may be formed in each of the empty spaces. The gate dielectric patterns GI may be formed by, for example, an atomic layer deposition (ALD) and/or chemical oxidation process to conformally cover inner surfaces of the empty spaces. Thereafter, a gate electrode layer (not shown) may be formed to fully fill the empty spaces, and then, the gate electrodes GE may be formed by planarizing and recessing an upper portion of the gate electrode layer. The gate capping patterns GP may be formed in recessed regions of the gate electrodes GE, respectively.

The interlayer insulating layer 110 may be formed on the substrate 100. The interlayer insulating layer 110 may include the first interlayer insulating layer 111 and a second interlayer insulating layer 112, which covers the gate capping patterns GP and the gate spacers GSP. The formation of the interlayer insulating layer 110 may include forming the second interlayer insulating layer 112 to cover the gate capping patterns GP and the gate spacers GSP. The second interlayer insulating layer 112 may be formed of or include at least one of silicon oxide or low-k oxide materials (e.g., carbon-doped silicon oxide (SiCOH)). The second interlayer insulating layer 112 may be formed by a CVD process.

A mask pattern MP having an opening OP may be formed on the interlayer insulating layer 110. The mask pattern MP may cover the first and second logic cells LC1 and LC2. The opening OP may expose the interlayer insulating layer 110 on a boundary between the first and second logic cells LC1 and LC2. The opening OP may be vertically overlapped with the gate electrode GE, which is located on the boundary between the first and second logic cells LC1 and LC2.

Referring to FIGS. 7 and 8A to 8D, an etching process may be performed using the mask pattern MP as an etch mask. As a result of the etching process, the gate capping pattern GC, the gate electrode GE, the gate dielectric pattern GI, upper portions of the active patterns AP, and upper portions of the first and second device isolation layers ST1 and ST2 below the opening OP may be removed, and as a result, a lower recess LR may be formed. During the etching process, the gate spacers GSP, which are formed on opposite side surfaces of the removed gate electrode GE, may be partially removed, and in this case, remaining portions of the gate spacers GSP may form the separation spacers SSP. A width of each of the separation spacers SSP may be smaller than or substantially equal to a width of each of the gate spacers GSP, which are not etched, when measured in the first direction D1.

The lower recess LR may include the first lower recesses LR1 and the second lower recesses LR2. The first lower recesses LR1 may be regions, which are formed by removing the upper portions of the active patterns AP, and the second lower recesses LR2 may be regions, which are formed by removing the upper portions of the first and second device isolation layers ST1 and ST2. The lower recess LR may be vertically overlapped with the opening OP.

Figure 9:
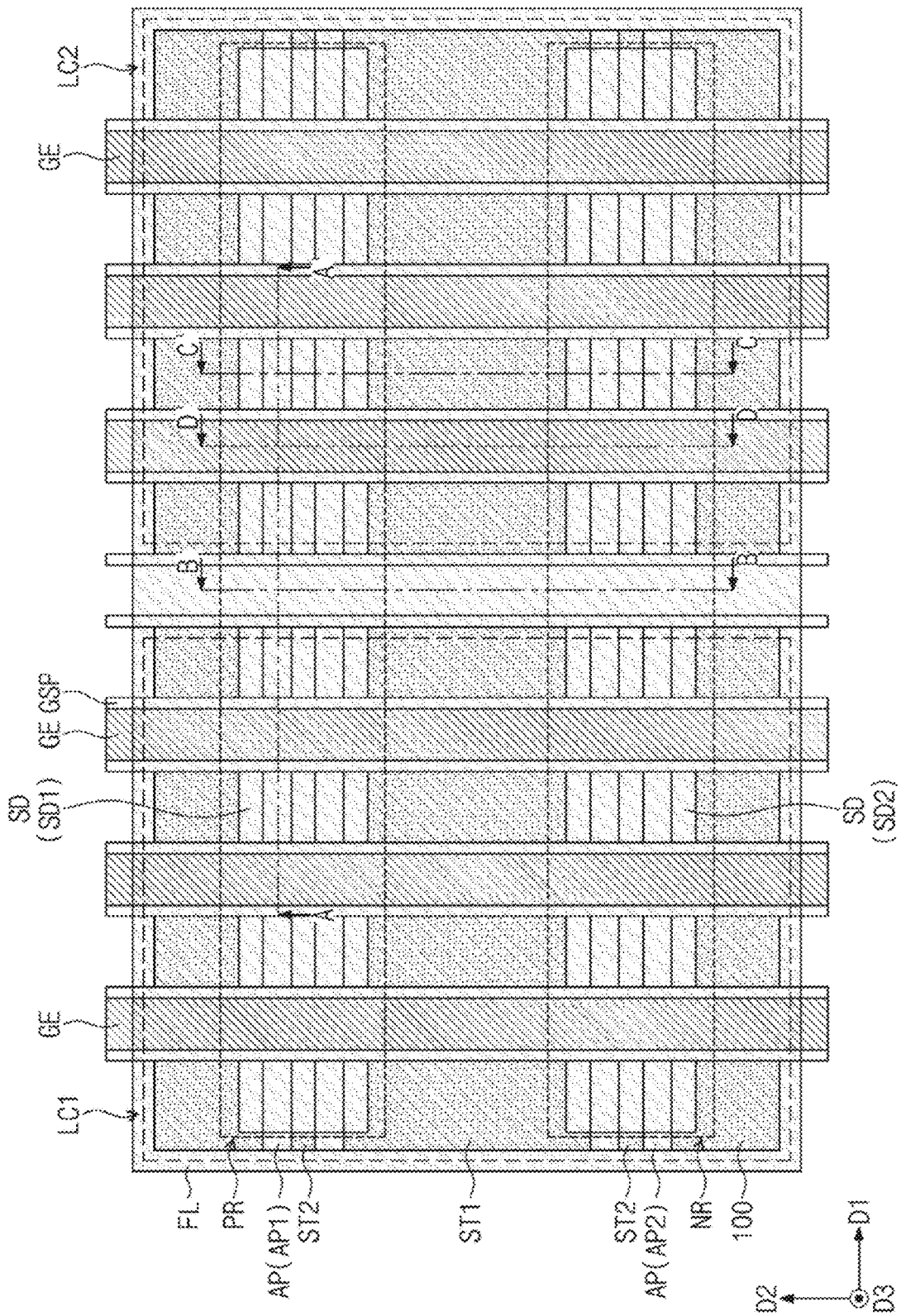
Figure 10A:
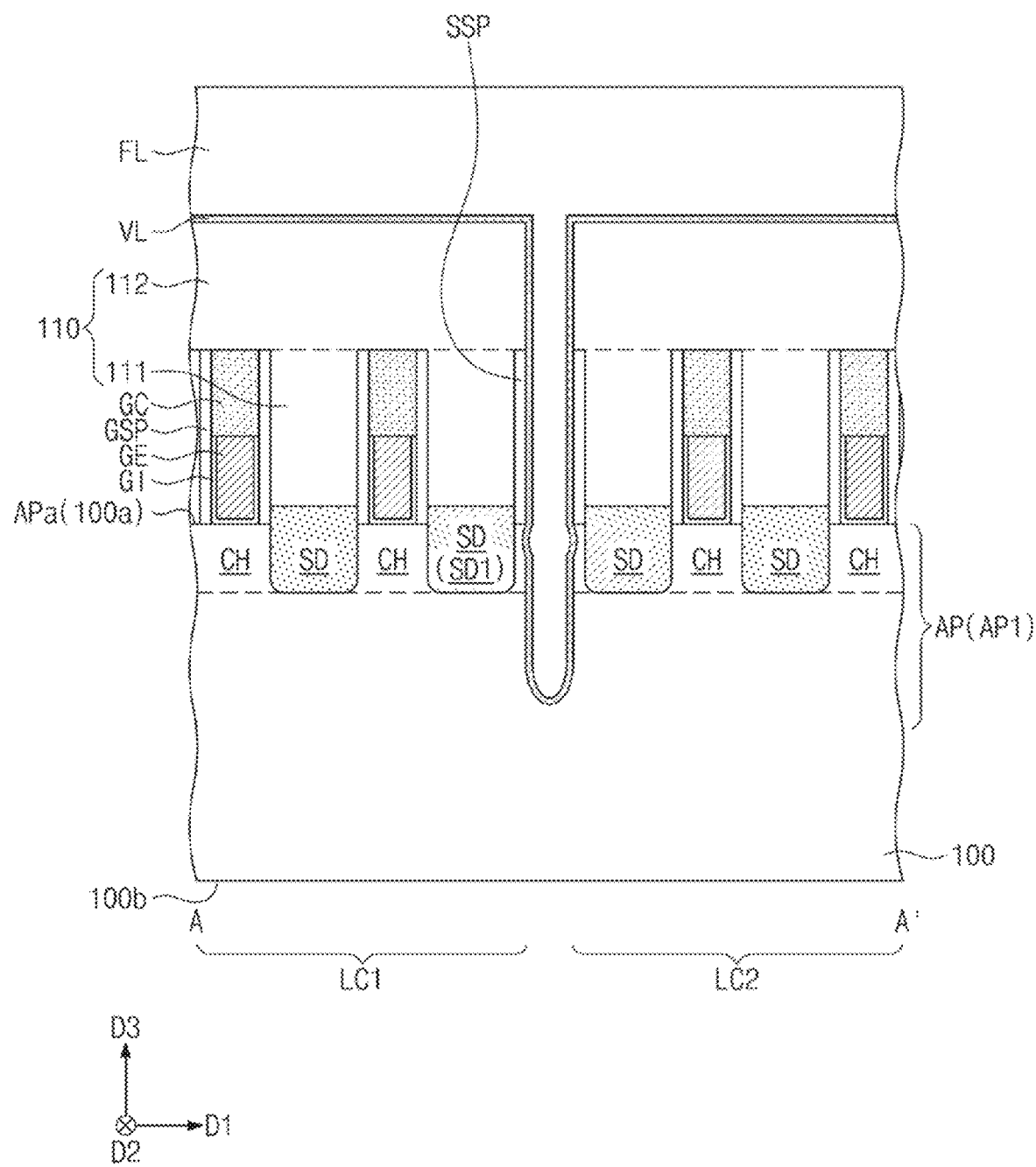
FIGS. 10A to 10D are sectional views, which are respectively taken along lines A-A', B-B', C-C', and D-D' of FIG. 9.
Figure 10B:
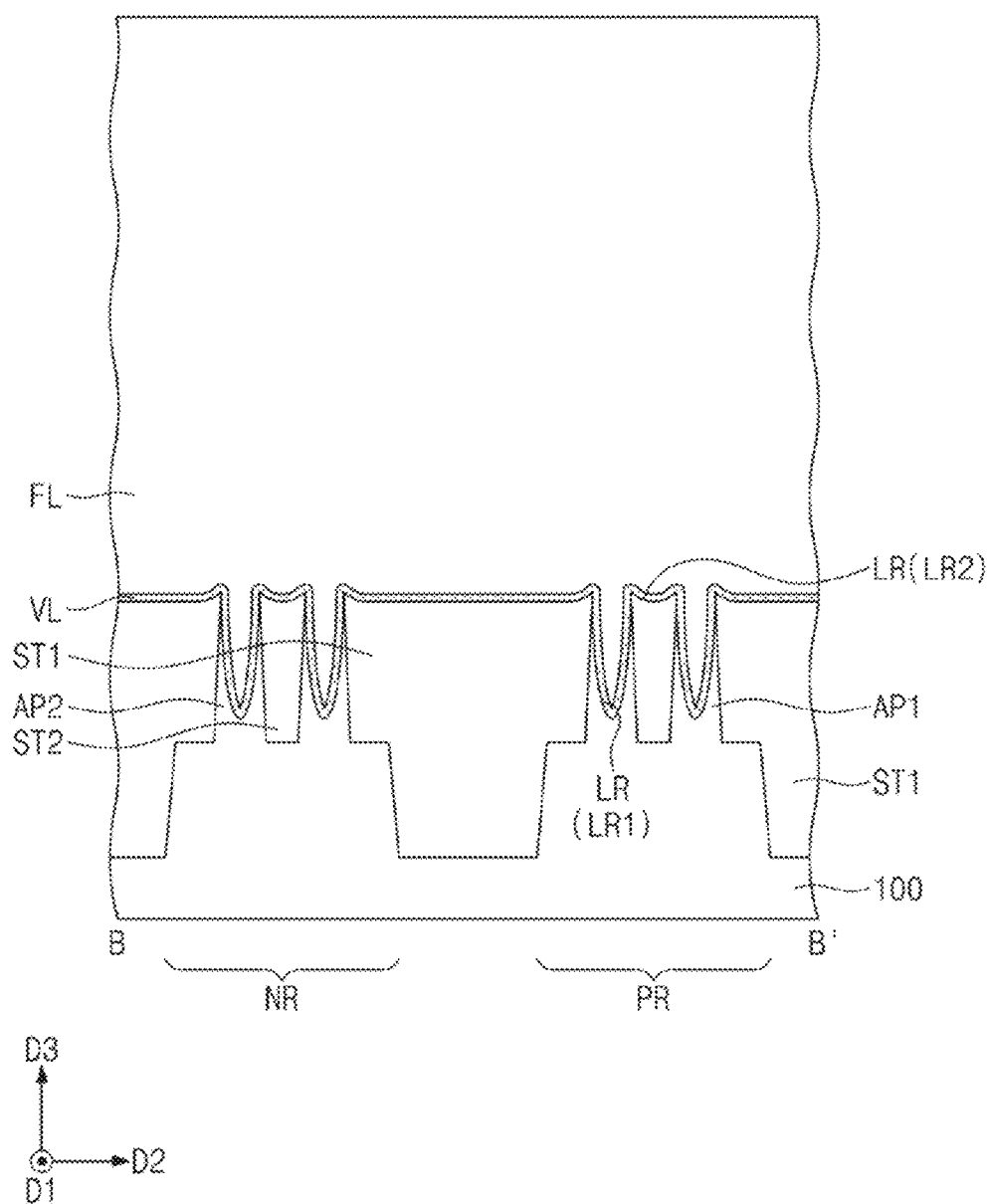
Figure 10C:
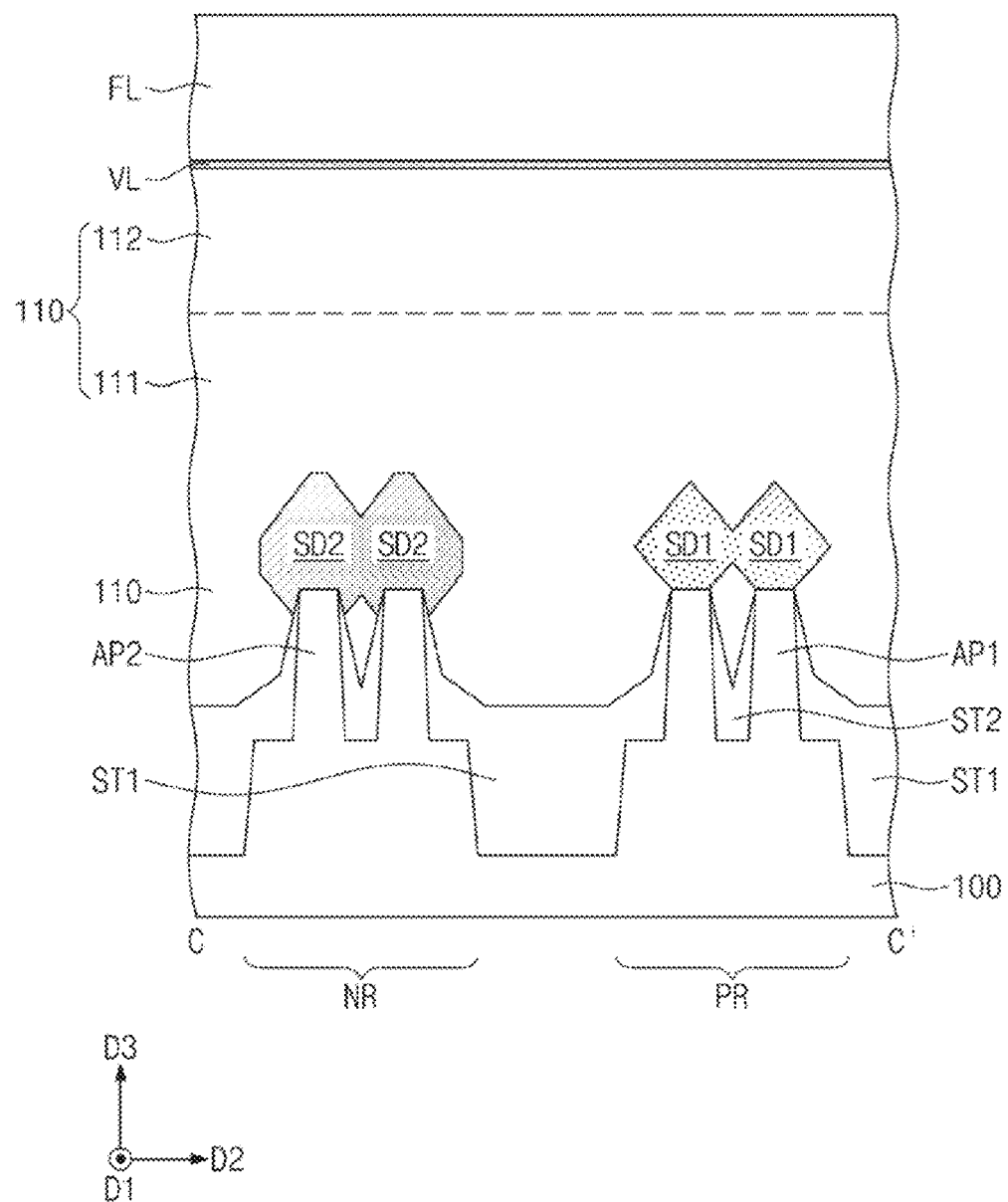
Figure 10D:
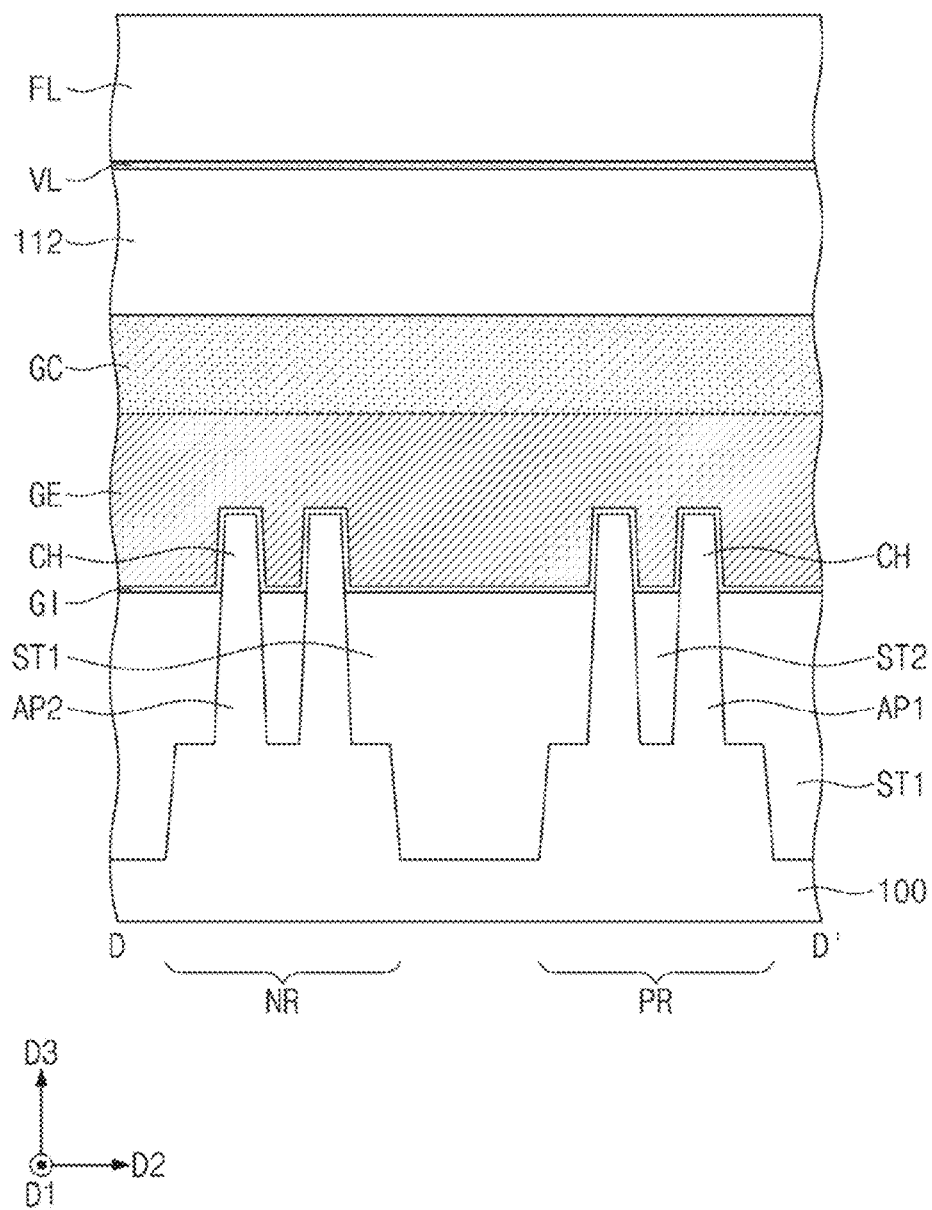
Figure 11:
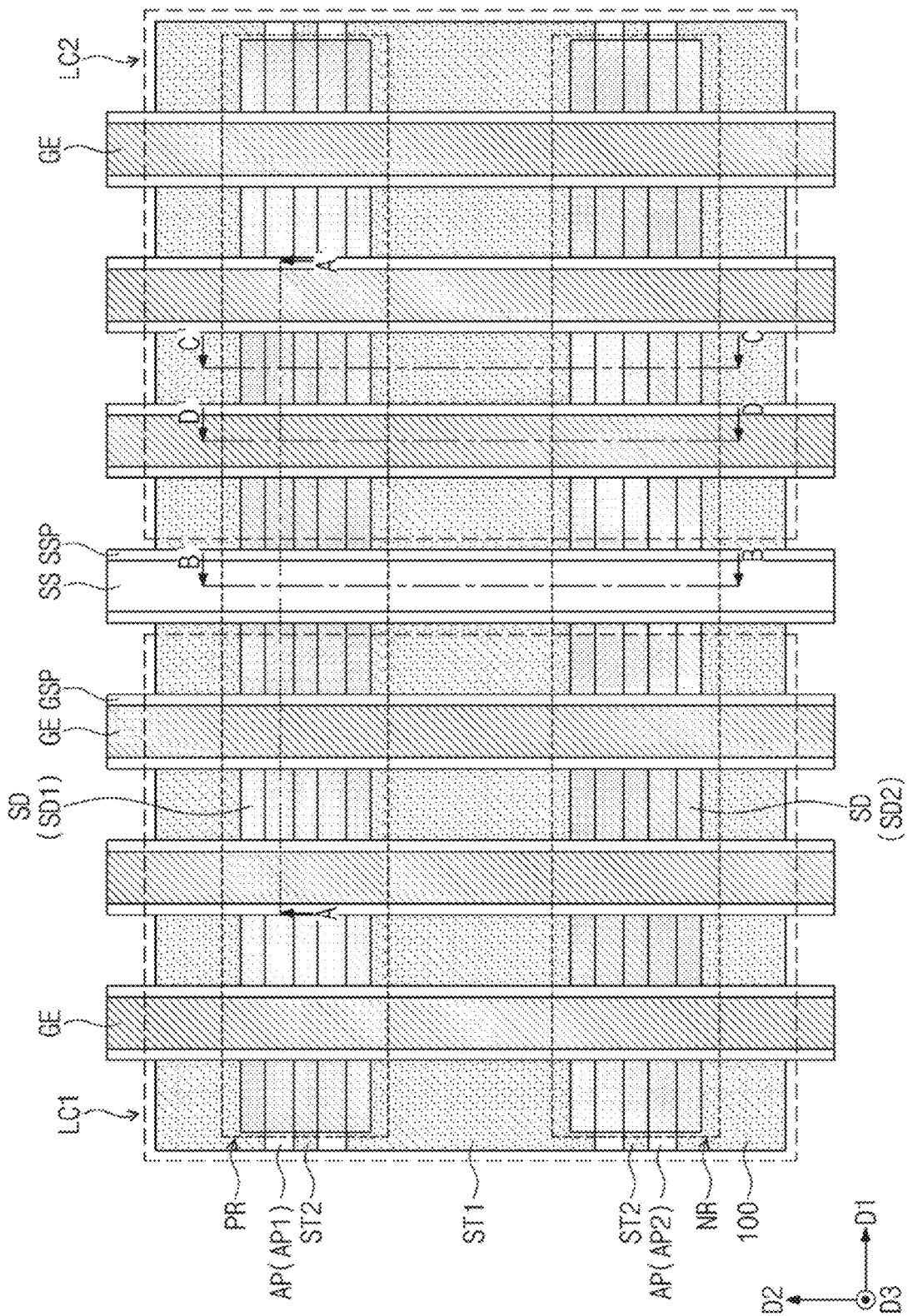
Figure 12A:
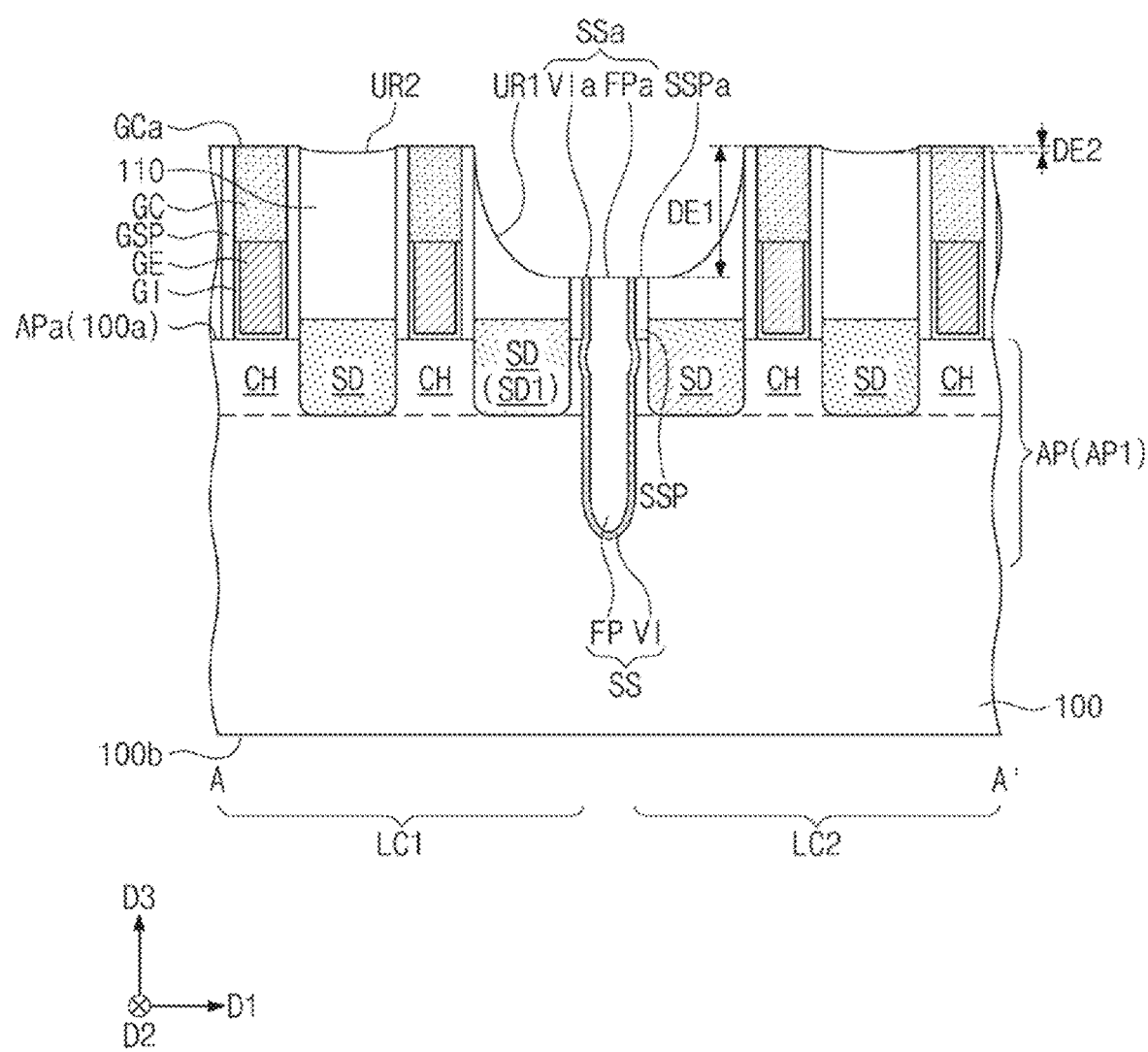
FIGS. 12A to 12D are sectional views, which are respectively taken along lines A-A', B-B', C-C', and D-D' of FIG. 11.
Figure 12B:
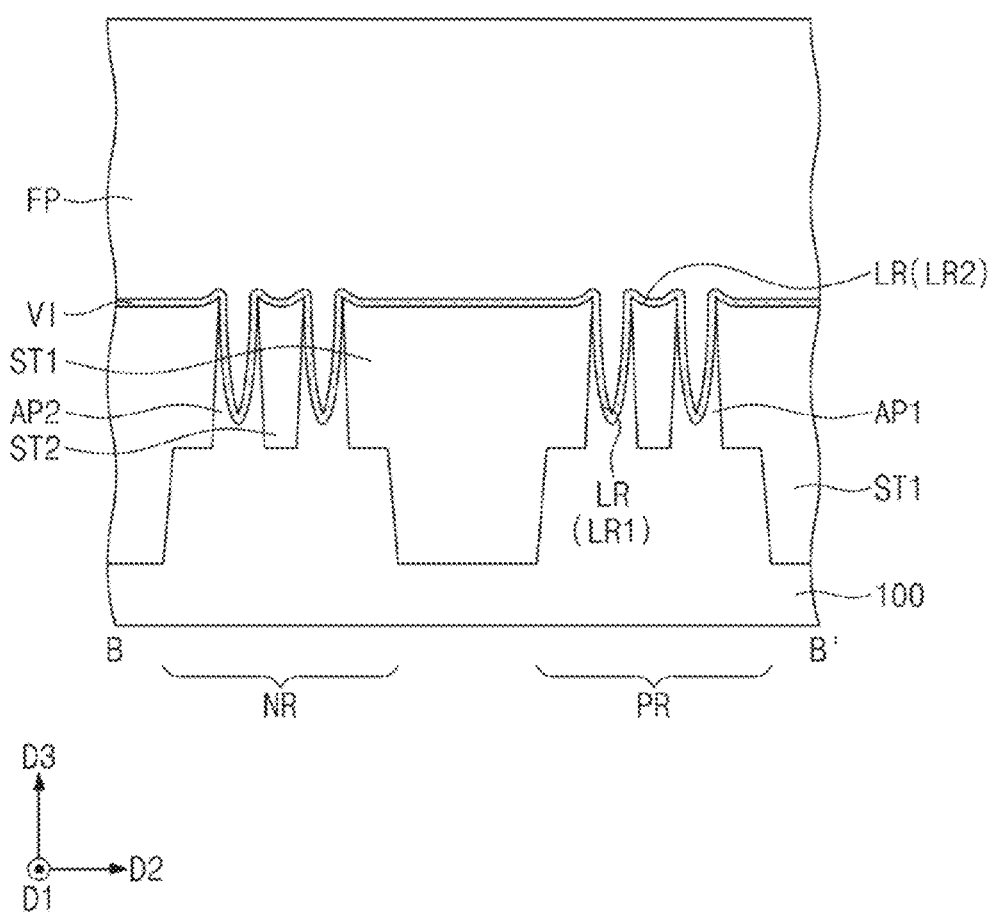
Figure 12C:
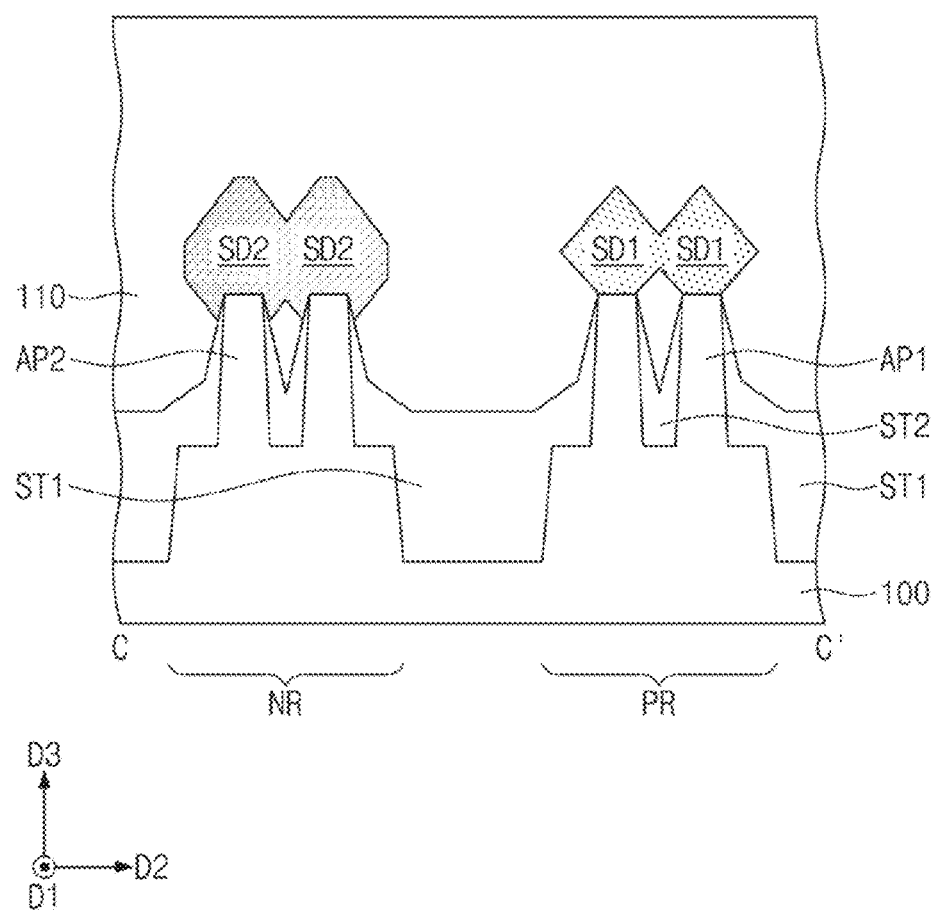
Figure 12D:
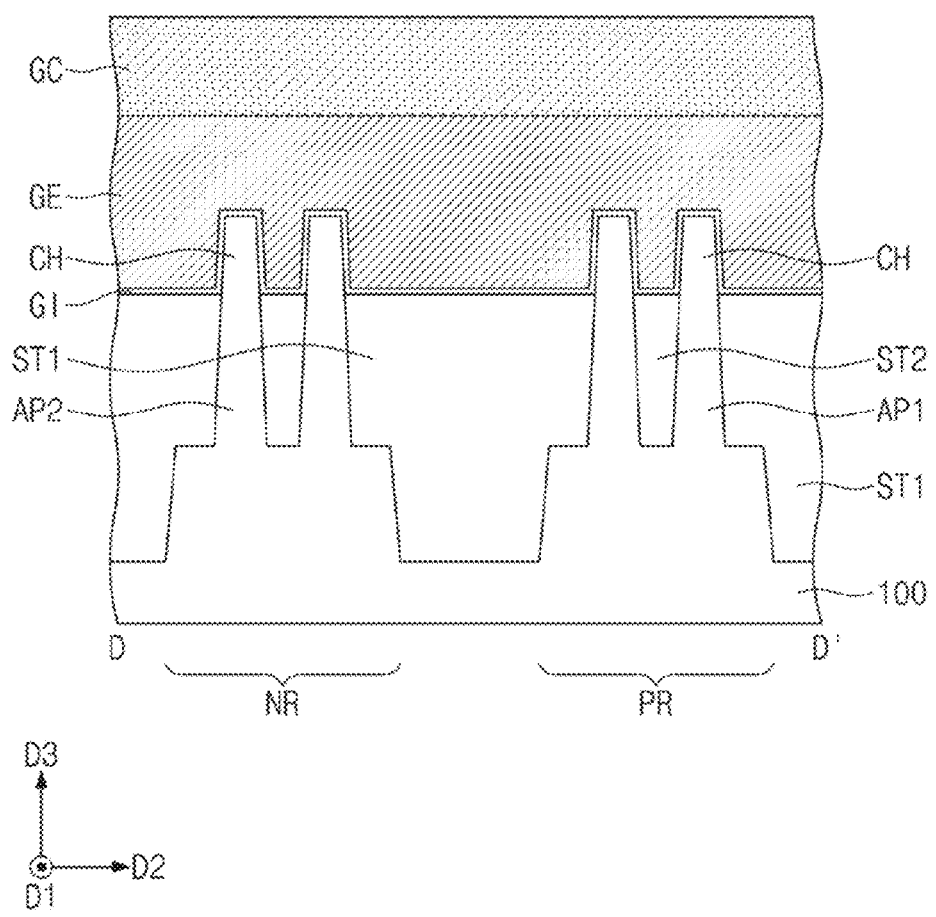

Referring to FIGS. 9, 10A, and 10B, a vertical insulating layer VL and a filling layer FL may be formed to fill the lower recess LR and to cover the interlayer insulating layer 110. In detail, the vertical insulating layer VL may conformally cover an inner side surface of the lower recess LR and may be extended to a region on a top surface of the interlayer insulating layer 110. Thereafter, the filling layer FL may be formed to fill a remaining portion of the lower recess LR and to cover the vertical insulating layer VL.

The filling layer FL and the vertical insulating layer VL may be formed of or include different materials from each other. In various example embodiments, the vertical insulating layer VL may be formed of or include a material whose dielectric constant is lower than the filling layer FL. As an example, the filling layer FL may be formed of or include silicon oxide, and the vertical insulating layer VL may be formed of or include silicon carbon oxide (SiOC) having a dielectric constant less than silicon oxide. At least one of the filling layer FL or the vertical insulating layer VL may be formed of or include a material whose dielectric constant is lower than the gate capping patterns GC.

The gate capping patterns GC may be formed of or include a material having polishing selectivity (e.g. a slower polish rate) with respect to at least one of the filling layer FL or the vertical insulating layer VL. For example, the filling layer FL may be formed of or include silicon oxide, and the vertical insulating layer VL may be formed of or include silicon carbon oxide. In this case, the gate capping patterns GC may be formed of or include a material (e.g., silicon nitride) having polishing selectivity with respect to the filling layer FL and the vertical insulating layer VL.

The filling layer FL may be formed of or include the same material as the interlayer insulating layer 110. In some example embodiments, the filling layer FL and the interlayer insulating layer 110 may be formed of or include silicon oxide. The gate capping patterns GC may be formed of or include a material having polishing selectivity with respect to the interlayer insulating layer 110.

Referring to FIGS. 11 and 12A to 12D, a polishing process may be performed on the filling layer FL and the vertical insulating layer VL to form the separation structure SS. The filling pattern FP and the vertical insulating pattern VI may be respectively formed by removing upper portions of the filling layer FL and the vertical insulating layer VL through the polishing process. The separation structure SS may include the filling pattern FP and the vertical insulating pattern VI.

As a result of the polishing process, an upper portion of each of the separation spacers SSP may be removed. Since the upper portions of the separation spacers SSP are removed, the top surfaces SSPa of the separation spacers SSP may be substantially coplanar with the top surface SSa of the separation structure SS.

An upper portion of the interlayer insulating layer 110 (e.g., the second interlayer insulating layer 112 and an upper portion of the first interlayer insulating layer 111) may be further removed by the polishing process. Since the upper portion of the interlayer insulating layer 110 is removed, the top surfaces GCa of the gate capping patterns GC may be exposed. Due to the polishing selectivity of the gate capping patterns GC, upper portions of the gate capping patterns GC may not be substantially removed or may be removed less than the filling layer FL and the vertical insulating layer VL. Accordingly, the top surface SSa of the separation structure SS (i.e., the top surface FPa of the filling pattern FP and the top surface VIa of the vertical insulating pattern VI) may be located at a height lower than the top surfaces GCa of the gate capping patterns GC. The top surfaces SSPa of the separation spacers SSP may be located at a height lower than the top surfaces GCa of the gate capping patterns GC.

Due to a difference in polishing selectivity or polishing rates between the patterns, a first upper recess UR1 may be formed during the polishing process. The first upper recess UR1 may be a region, which is enclosed by the top surface SSa of the separation structure SS and an inner surface of the interlayer insulating layer 110 adjacent to the separation structure SS. A second upper recess UR2 may be further formed between adjacent ones of the gate electrodes GE. The second upper recess UR2 may be a region, which is enclosed by the interlayer insulating layer 110 interposed between the adjacent ones of the gate electrodes GE. A first depth DE1 of the first upper recess UR1 in the third direction D3 may be larger than a second depth DE2 of the second upper recess UR2 in the third direction D3.

Referring back to FIGS. 1, 2A to 2D, and 3, the separation capping pattern SC may be formed on the separation structure SS. The separation capping pattern SC may fill the first upper recess UR1. The separation capping pattern SC may cover the top surface SSa of the separation structure SS and may be extended to regions on top surfaces of the separation spacers SSP. The separation capping pattern SC may be formed of or include the same material as the separation structure SS. For example, at least one of the filling pattern FP or the vertical insulating pattern VI of the separation structure SS may be formed of or include the same material as the separation capping pattern SC.

The active contacts CT may be formed to penetrate the interlayer insulating layer 110, and each of the active contacts CT may be electrically connected to the source/drain patterns SD, respectively. The formation of the active contacts CT may include forming contact holes (not shown) to expose the source/drain patterns SD and to penetrate the interlayer insulating layer 110 and forming a conductive layer to fill the contact holes. Ones of the active contacts CT, which are adjacent to the separation structure SS, may further penetrate the separation capping pattern SC. Although not shown, a plurality of interconnection layers may be formed on the gate capping patterns GC, the active contacts CT, and the separation capping pattern SC in a subsequent step.

According to various example embodiments, when the polishing process is performed to form the separation structure SS, the gate capping patterns GC may be formed of or include a material having polishing selectivity with respect to the filling layer FL, the vertical insulating layer VL, and the interlayer insulating layer 110. By using the polishing selectivity between the patterns, the separation structure SS may be formed through a minimized polishing process. As a result, it may be possible to improve productivity in a process of fabricating a semiconductor device.

Figure 13:
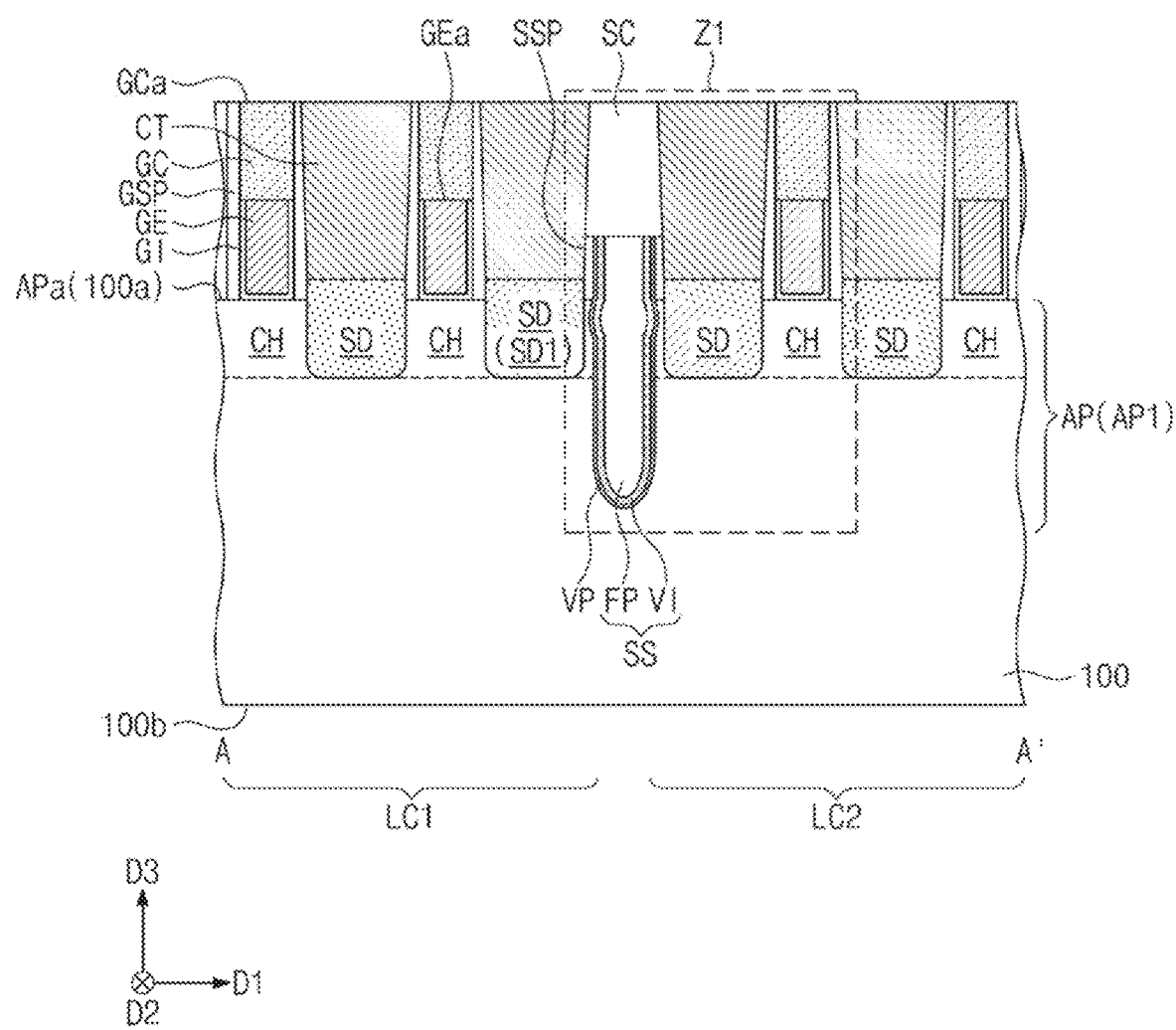
FIGS. 13 and 16 are sectional views, each of which is taken along the line A-A' of FIG. 1.
Figure 14:
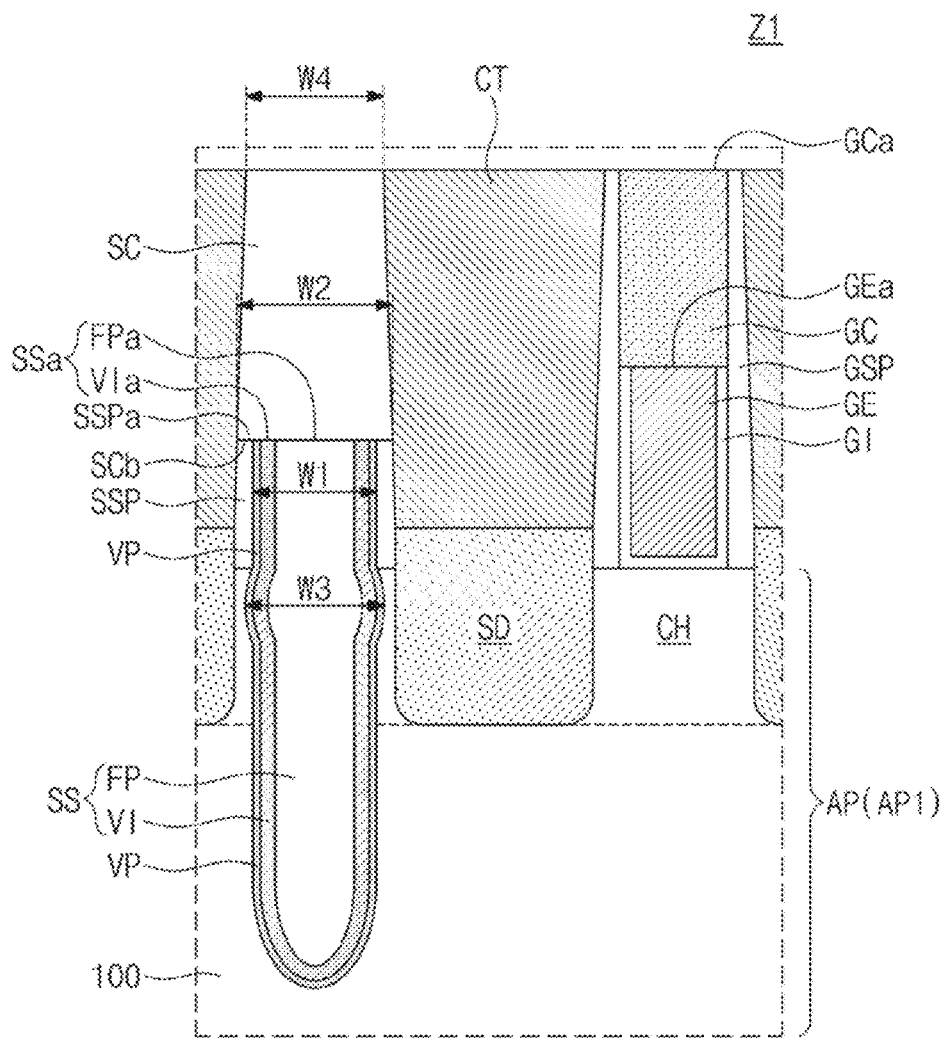
FIGS. 14 and 17 are enlarged sectional views corresponding to portions Z1 of FIGS. 13 and 16, respectively.

FIG. 13 is a sectional view, which is taken along the line A-A' of FIG. 1 to illustrate a semiconductor device according to various example embodiments. FIG. 14 is an enlarged sectional view corresponding to a portion Z1 of FIG. 13. For concise description, a previously described element may be identified by the same reference number without repeating an overlapping description thereof.

Referring to FIGS. 13 and 14, a vertical pattern VP may be provided on the vertical insulating pattern VI. The vertical pattern VP may be interposed between the vertical insulating pattern VI and the separation spacers SSP and between the vertical insulating pattern VI and the substrate 100. The vertical pattern VP may cover the vertical insulating pattern VI. A top surface of the vertical pattern VP may be substantially coplanar with the top surface SSa of the separation structure SS. In some example embodiments, the vertical pattern VP may be formed of or include silicon nitride.

The separation capping pattern SC may be provided on the separation structure SS, and the second width W2 of the separation capping pattern SC may be larger than the fourth width W4 of the separation capping pattern SC.

Figure 7:
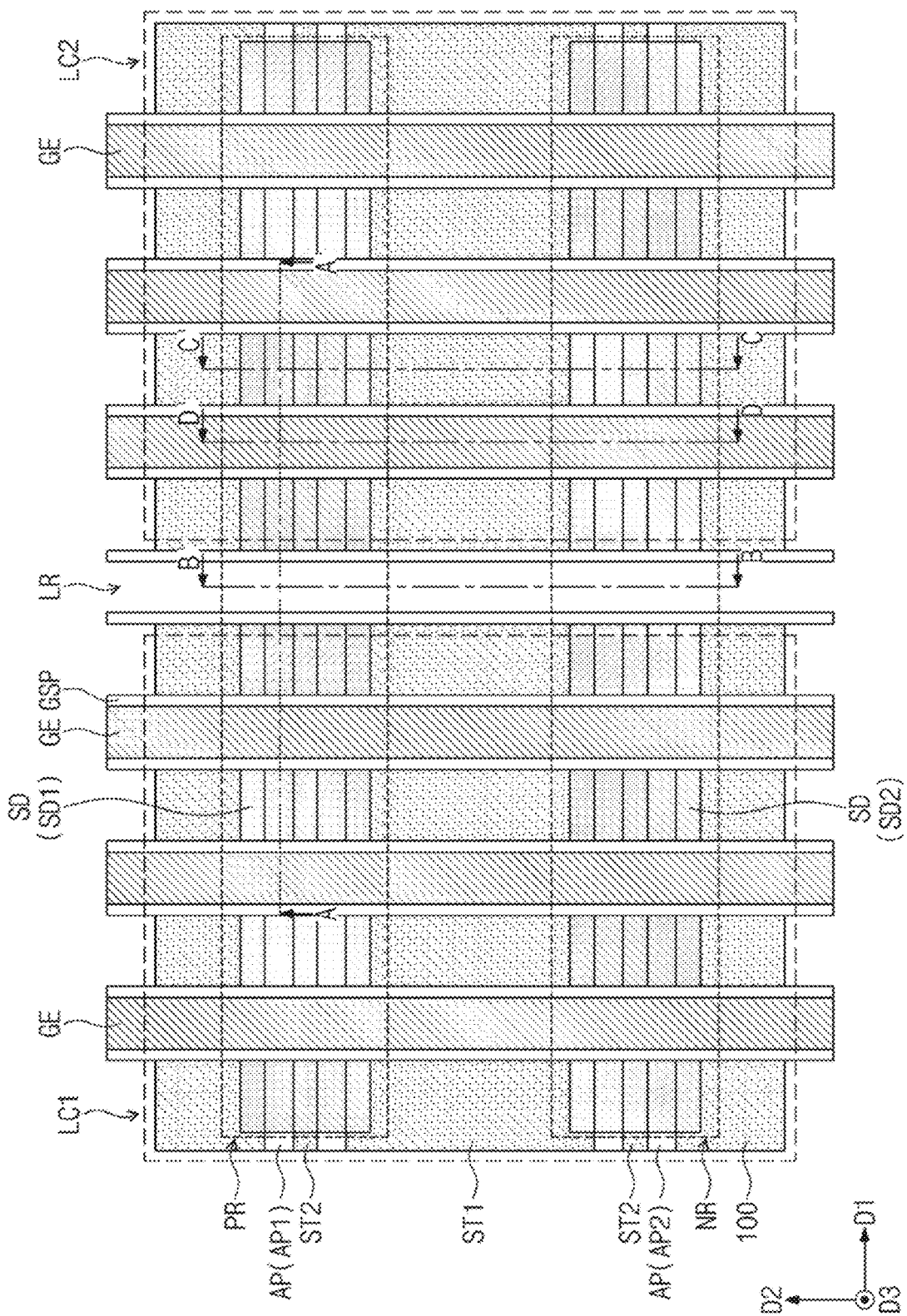
Figure 8A:
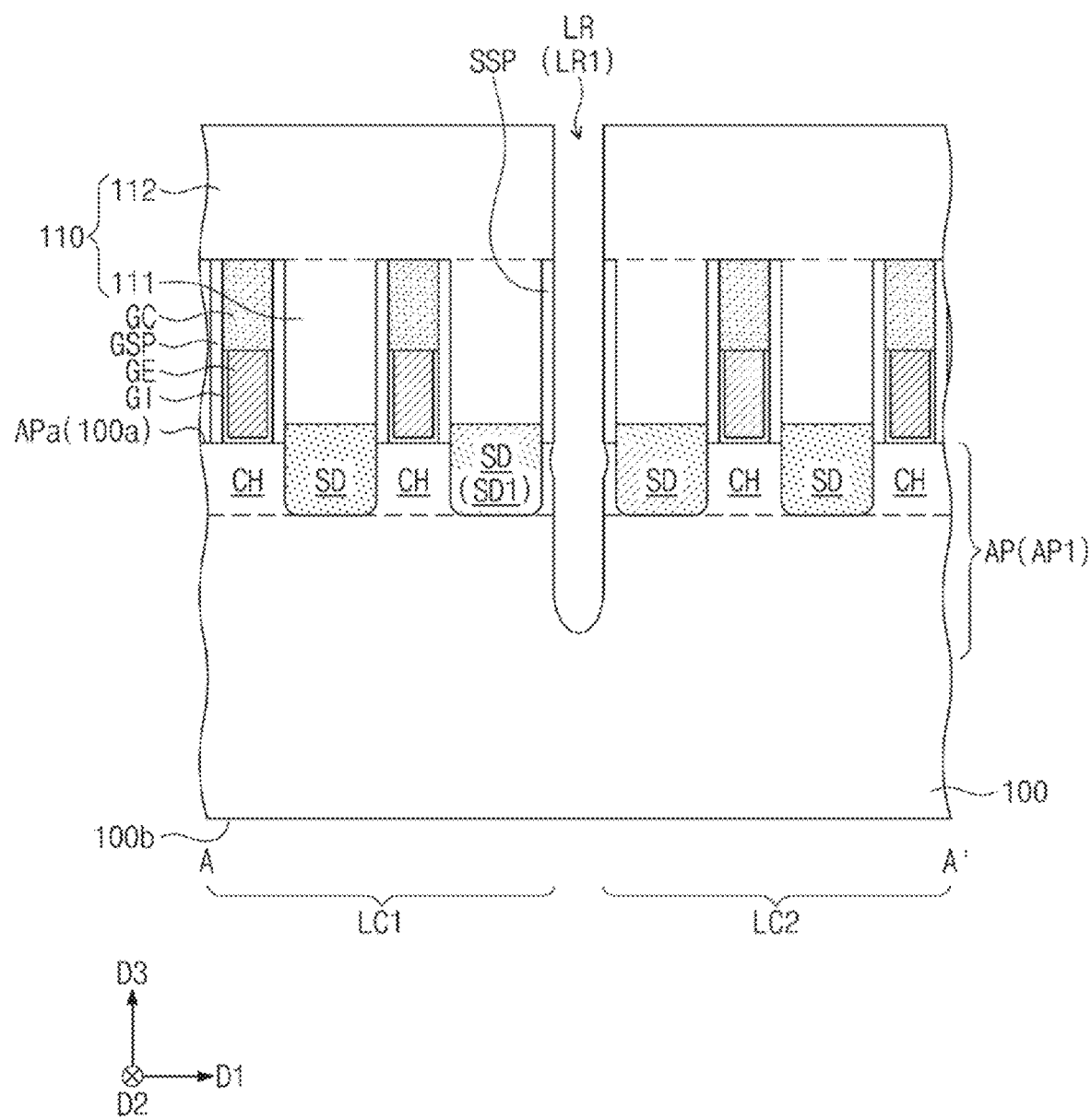
FIGS. 8A to 8D are sectional views, which are respectively taken along lines A-A', B-B', C-C', and D-D' of FIG. 7.
Figure 8B:
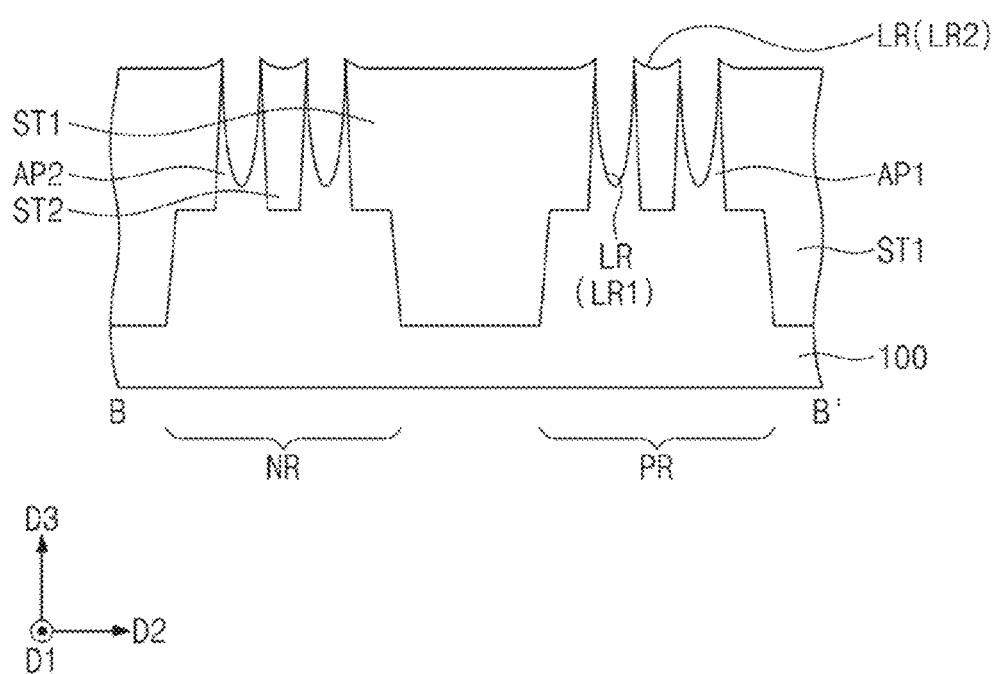
Figure 8C:
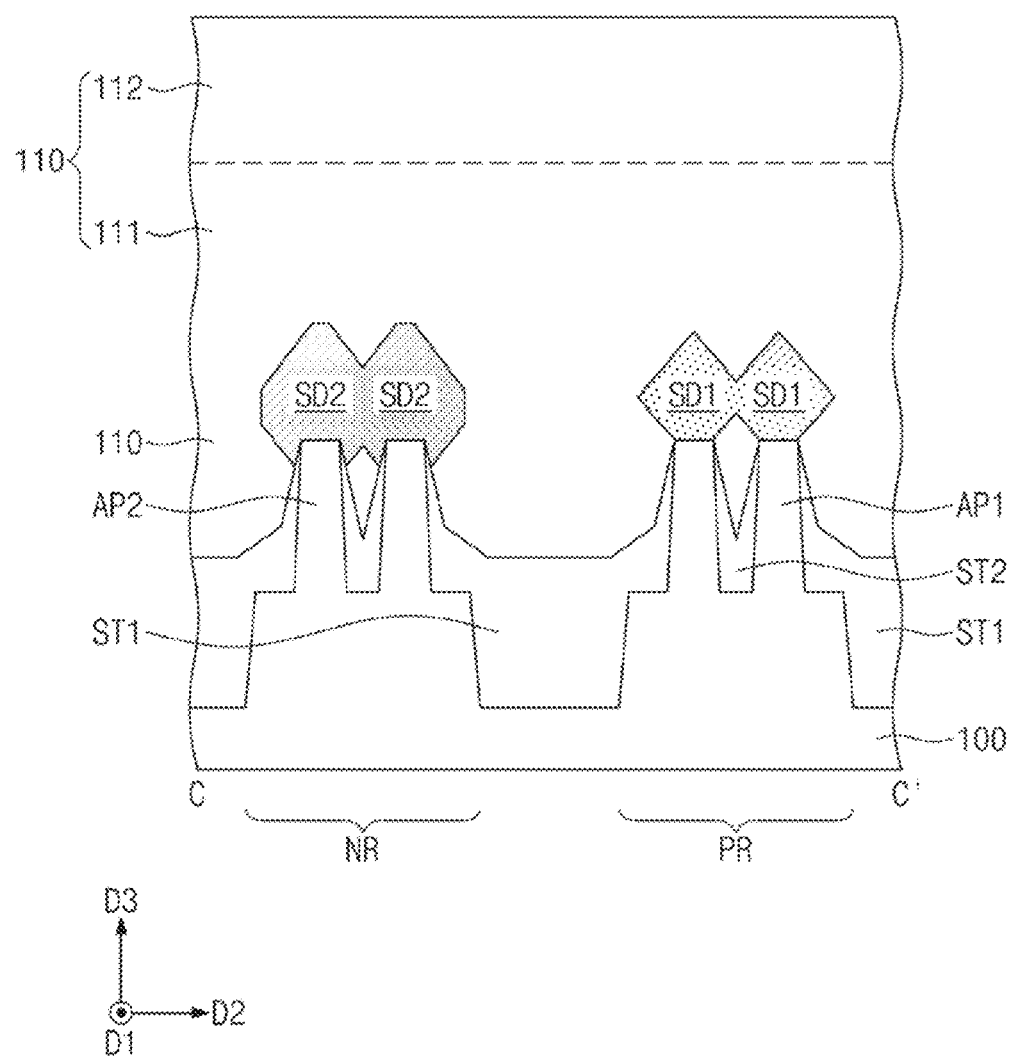
Figure 8D:
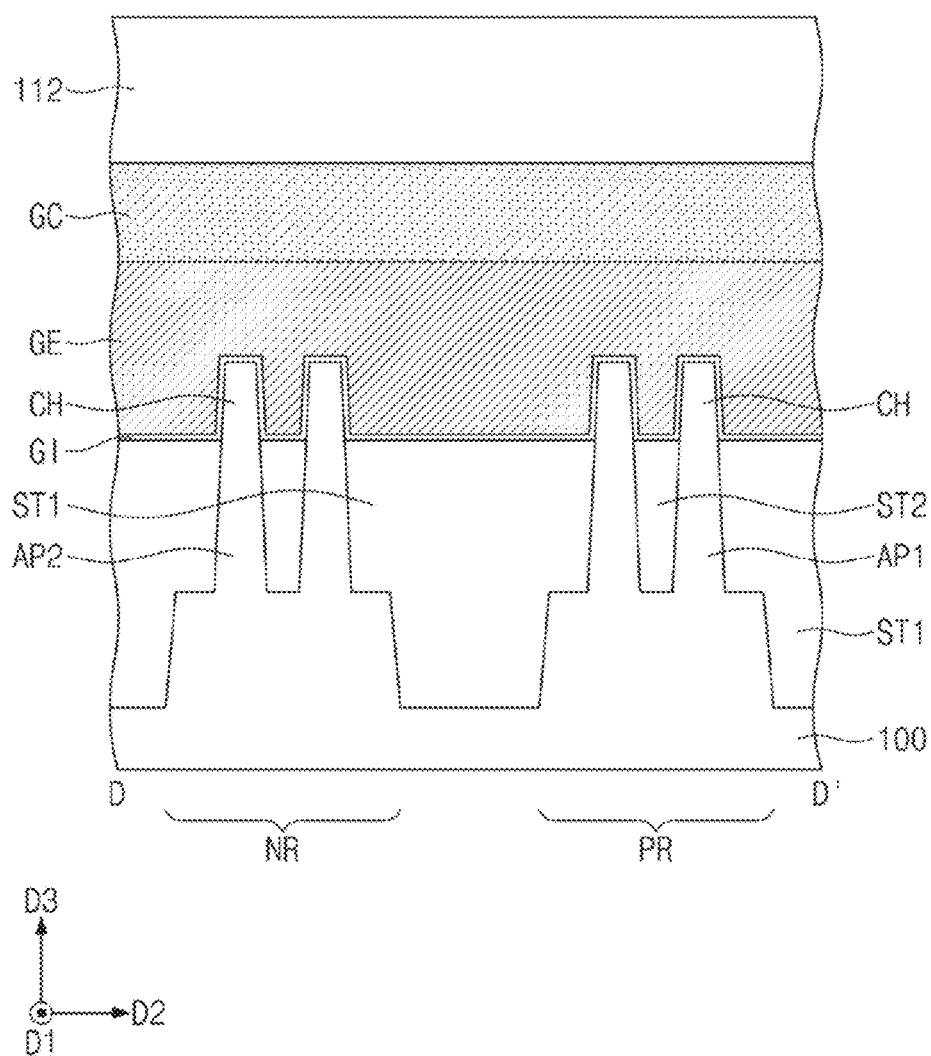
Figure 15:
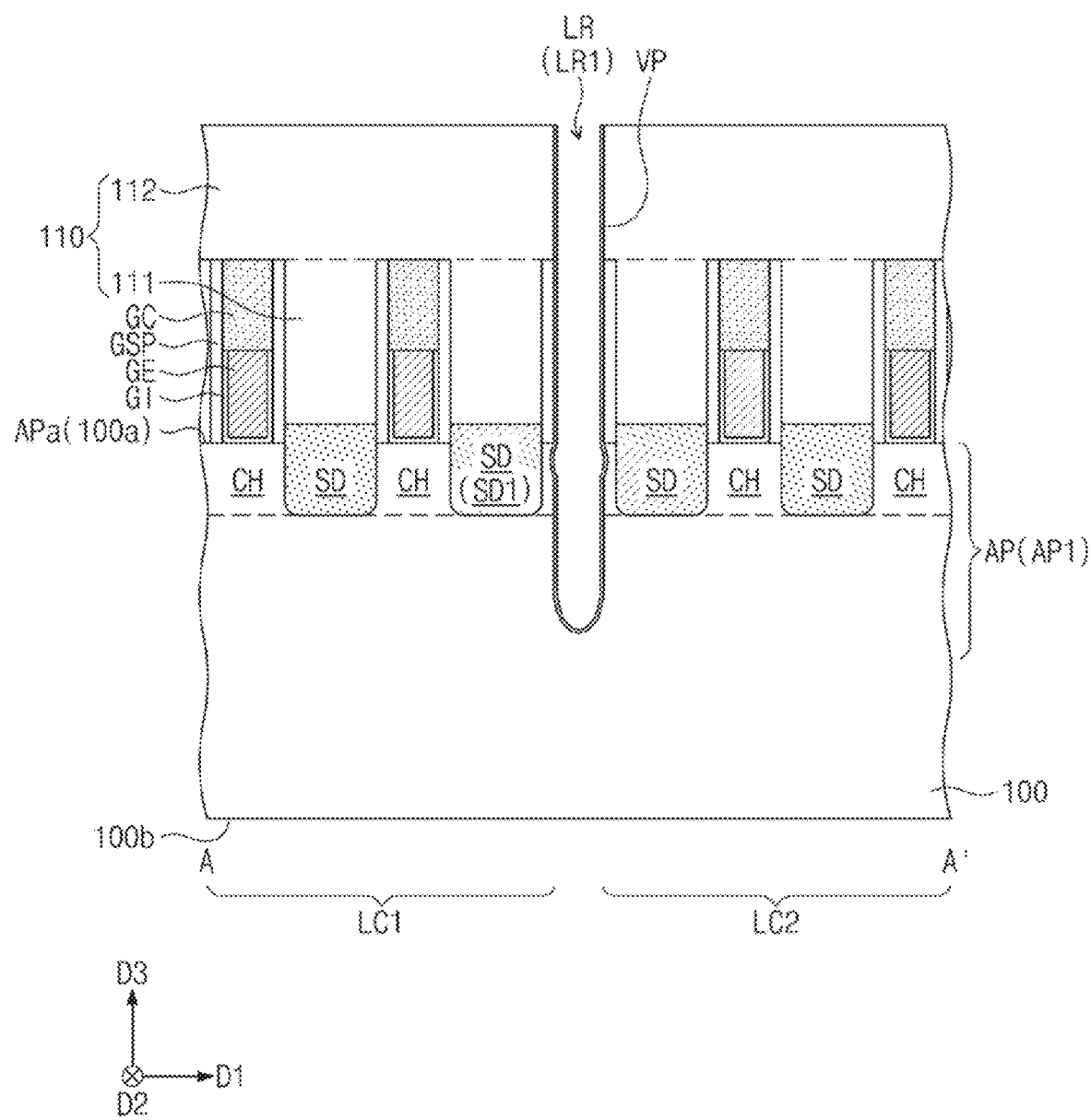
FIGS. 15 and 18 are sectional views, which are taken along the line A-A' of FIG. 7 to illustrate a method of fabricating a semiconductor device, according to various example embodiments FIGS. 13 and 16.

FIG. 15 is a sectional view, which is taken along the line A-A' of FIG. 7 to illustrate a method of fabricating the semiconductor device of FIG. 13. For concise description, a previously described element may be identified by the same reference number without repeating an overlapping description thereof.

Referring to FIGS. 7 and 15, an etching process may be performed to form the lower recess LR penetrating the interlayer insulating layer 110. The vertical pattern VP may be formed to cover an inner surface of the lower recess LR. In some example embodiments, the vertical pattern VP may conformally cover the inner surface of the lower recess LR. The etching process may be an anisotropic etching process, which is performed in the third direction D3, and in this case, the etching process in the first and second directions D1 and D2 may be minimized by the vertical pattern VP. A subsequent process may be performed in substantially the same manner as that described with reference to FIGS. 1, 2A to 2B, 3, 9, 10A to 10D, 11, and 12A to 12D.

Figure 16:
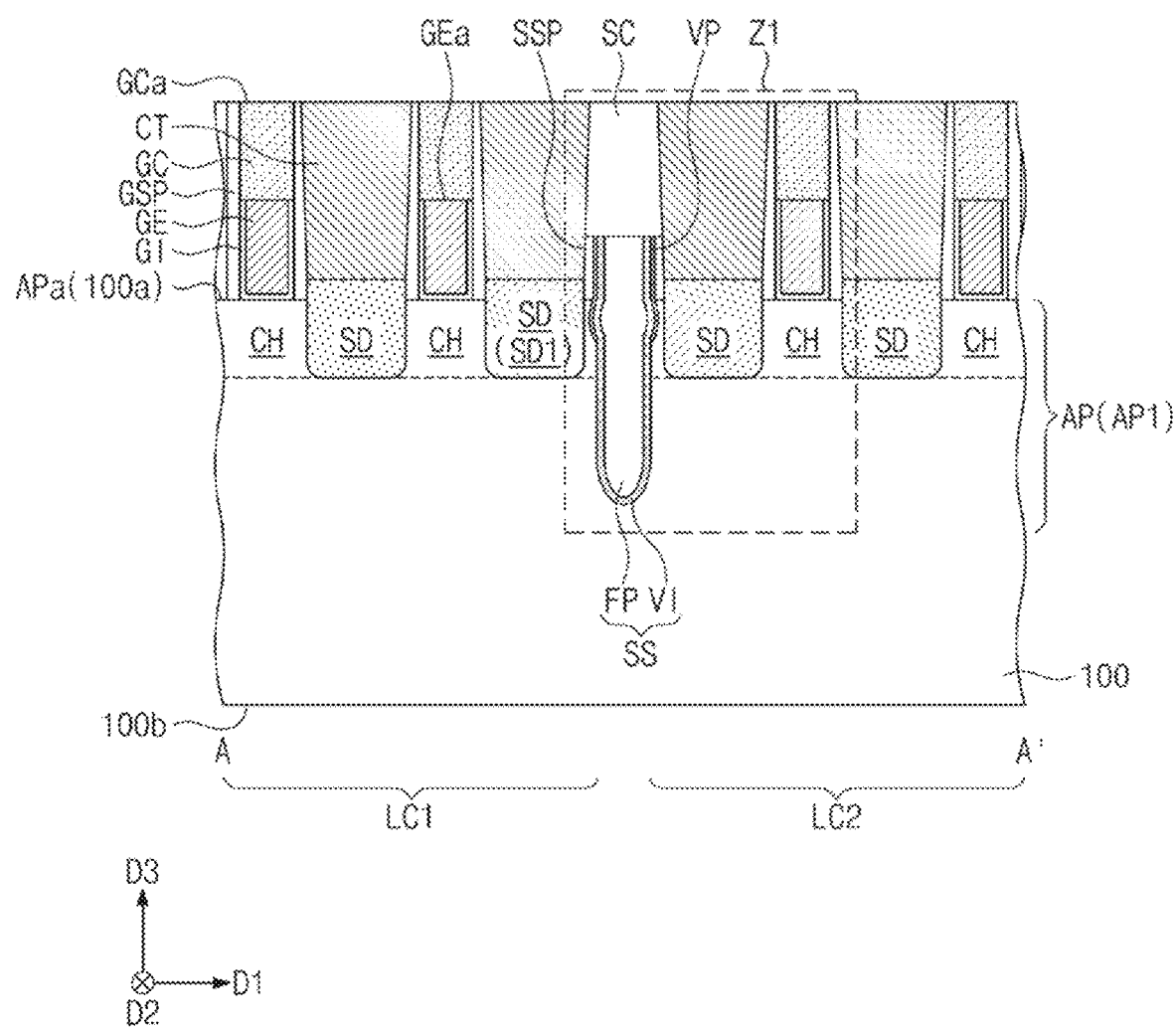
Figure 17:
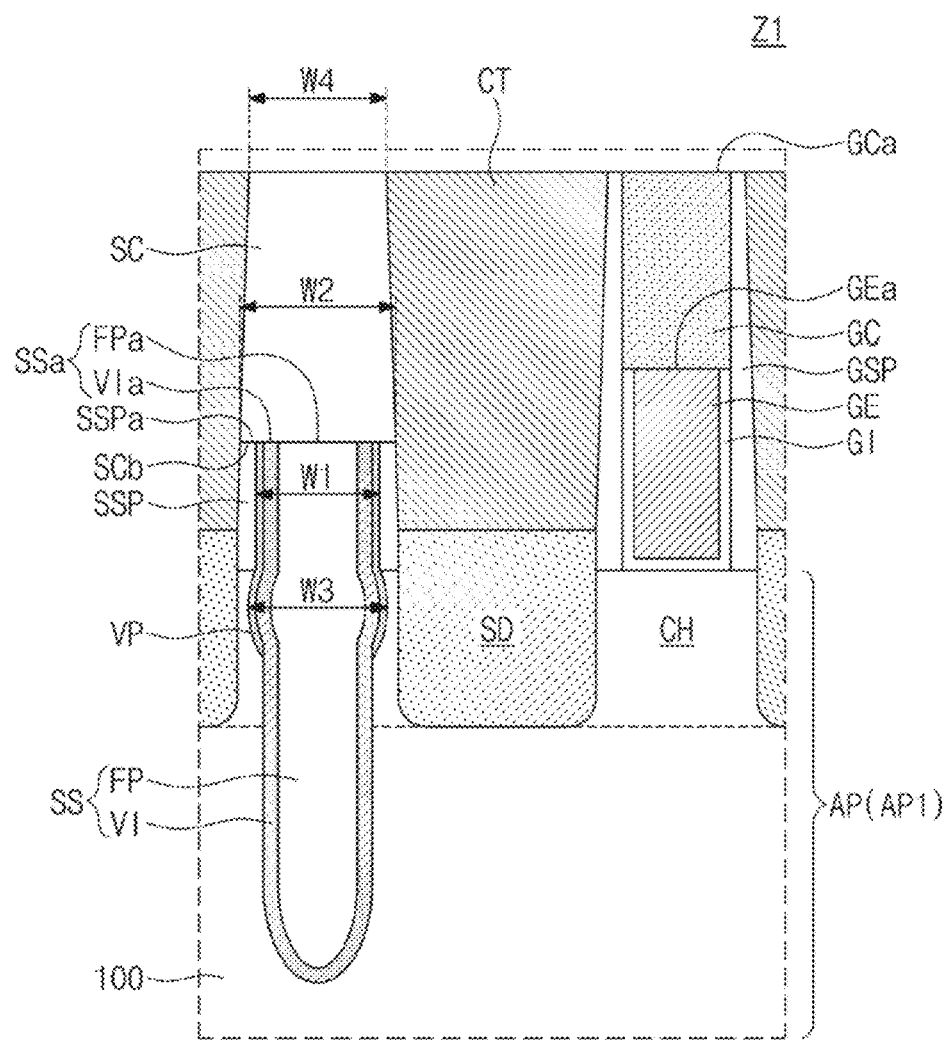

FIG. 16 is a sectional view, which is taken along the line A-A' of FIG. 1 to illustrate a semiconductor device according to various example embodiments. FIG. 17 is an enlarged sectional view corresponding to a portion Z1 of FIG. 16. For concise description, a previously described element may be identified by the same reference number without repeating an overlapping description thereof.

Referring to FIGS. 16 and 17, the vertical pattern VP may be provided on the vertical insulating pattern VI, near an upper portion of the active pattern AP. The vertical pattern VP may not be provided on the vertical insulating pattern VI, near a lower portion of the active pattern AP. The vertical pattern VP may be interposed between the vertical insulating pattern VI and the separation spacers SSP. The vertical pattern VP near the upper portion of the active pattern AP may cover the vertical insulating pattern VI. A top surface of the vertical pattern VP may be substantially coplanar with the top surface SSa of the separation structure SS. In some example embodiments, the vertical pattern VP may be formed of or include silicon nitride.

The separation capping pattern SC may be provided on the separation structure SS, and the second width W2 of the separation capping pattern SC may be larger than the fourth width W4 of the separation capping pattern SC.

Figure 18:
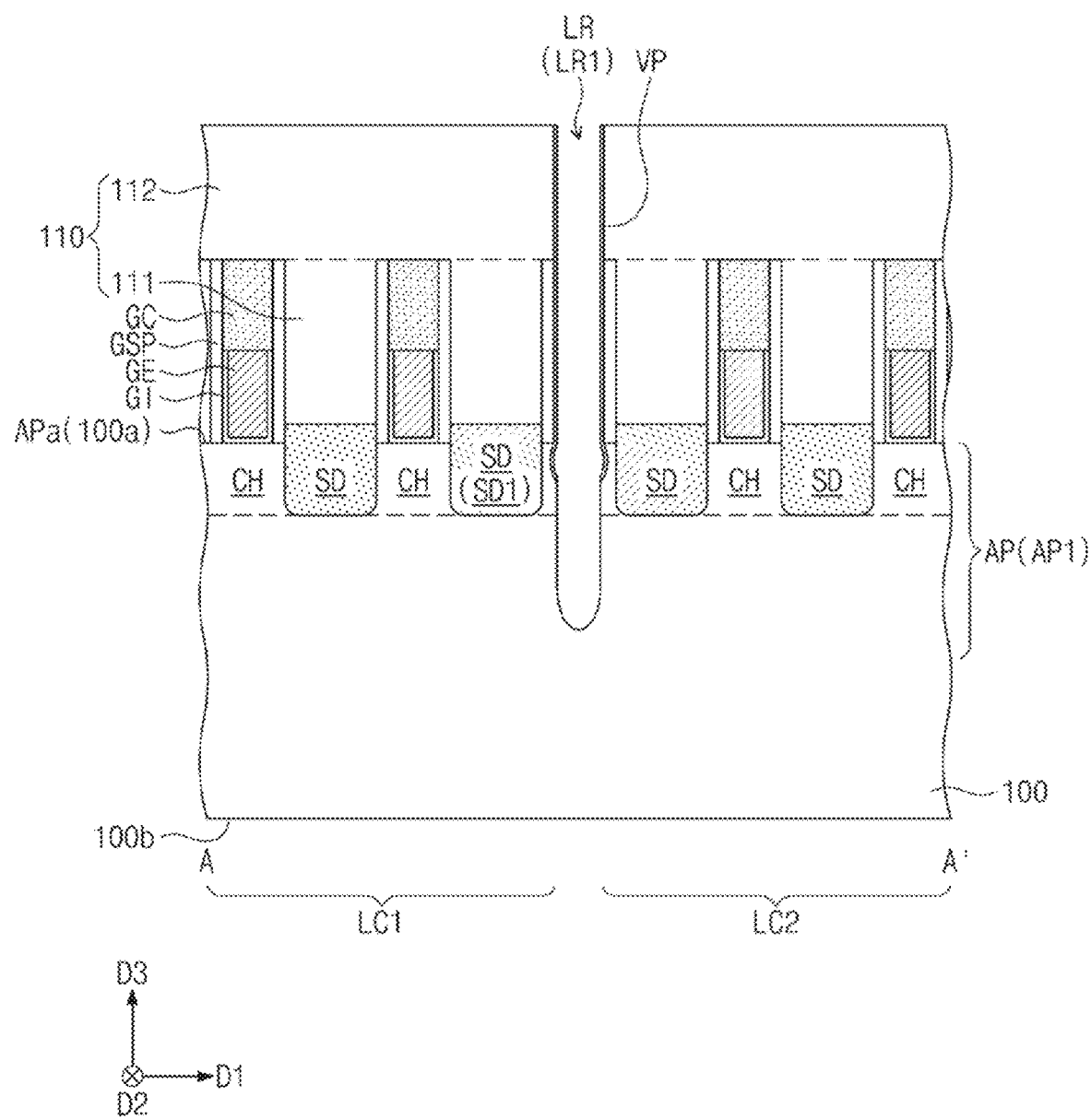

FIG. 18 is a sectional view, which is taken along the line A-A' of FIG. 7 to illustrate a method of fabricating the semiconductor device of FIG. 16. For concise description, a previously described element may be identified by the same reference number without repeating an overlapping description thereof.

Referring to FIGS. 7 and 18, an etching process may be performed to form the lower recess LR penetrating the interlayer insulating layer 110. The vertical patterns VP may cover inner side surfaces of an upper portion of the lower recess LR. As an example, the vertical patterns VP may conformally cover the inner side surfaces of the upper portion of the lower recess LR. The vertical patterns VP may not cover inner side surfaces of a lower portion of the lower recess LR. The etching process may be an anisotropic etching process, which is performed in the third direction D3, and in this case, the etching process in the first and second directions D1 and D2 may be minimized by the vertical pattern VP. A subsequent process may be performed in substantially the same manner as that described with reference to FIGS. 1, 2A to 2B, 3, 9, 10A to 10D, 11, and 12A to 12D.

According to various example embodiments, a separation structure, which includes a material with a low dielectric constant, may be provided. Accordingly, it may be possible to reduce an electric interference issue from occurring between adjacent ones of logic cells and to improve reliability of a semiconductor device.

While various example embodiments of inventive concepts have been particularly shown and described, it will be understood by one of ordinary skill in the art that variations in form and detail may be made therein without departing from the spirit and scope of the attached claims. Furthermore example embodiments are not necessarily mutually exclusive with one another. For example, some example embodiments may include one or more features described with reference to one or more drawings, and may also include one or more other features described with reference to one or more other drawings.

What is claimed is:

1. A semiconductor device, comprising:
a substrate comprising an active pattern extending in a first direction that is parallel to a bottom surface of the substrate;
a gate electrode extending in a second direction to cross the active pattern, the second direction parallel to the bottom surface of the substrate and crossing the first direction;
a gate capping pattern covering a top surface of the gate electrode; and
a separation structure at a side of the gate electrode and extending in the second direction to penetrate the active pattern in a third direction perpendicular to the bottom surface of the substrate,
wherein the separation structure comprises a filling pattern extending in the third direction to penetrate the active pattern, and a vertical insulating pattern interposed between the filling pattern and the gate electrode,
a top surface of the separation structure at a height lower than a top surface of the gate capping pattern with respect to a top surface of the substrate,
a middle portion of the separation structure has a bulge having a width in the first direction greater than a width at a top portion of the separation structure, and
the bulge is at a level below a top surface of the active pattern.

2. The semiconductor device of claim 1, further comprising:
a separation capping pattern covering the top surface of the separation structure,
wherein a first width of the top surface of the separation structure in the first direction is less than a second width of a bottom surface of the separation capping pattern in the first direction.

3. The semiconductor device of claim 2, wherein at least one of the filling pattern and the vertical insulating pattern comprises the same materials as the separation capping pattern.

4. The semiconductor device of claim 1, wherein the filling pattern and the vertical insulating pattern comprise different materials from each other.

5. The semiconductor device of claim 4, wherein the vertical insulating pattern comprises a material whose dielectric constant is less than that of the filling pattern.

6. The semiconductor device of claim 1, wherein a top surface of the filling pattern and a top surface of the vertical insulating pattern is at a height lower than the top surface of the gate capping pattern with respect to the top surface of the substrate.

7. The semiconductor device of claim 1, further comprising:
a separation spacer on a side surface of the separation structure,
wherein the vertical insulating pattern is interposed between the filling pattern and the separation spacer.

8. The semiconductor device of claim 7, wherein a top surface of the separation spacer is located at a height lower than the top surface of the gate capping pattern.

9. The semiconductor device of claim 7, further comprising:
a vertical pattern on the side surface of the separation structure,
wherein the vertical pattern is interposed between the vertical insulating pattern and the separation spacer.

10. The semiconductor device of claim 1, wherein the gate capping pattern comprises a material having a polishing selectivity with respect to the separation structure.

11. The semiconductor device of claim 1, wherein at least one of the filling pattern and the vertical insulating pattern comprises a material having a dielectric constant lower than that of the gate capping pattern.

12. The semiconductor device of claim 1, wherein the separation structure comprises at least one of silicon carbon oxide or silicon oxide.

13. The semiconductor device of claim 1, wherein a side surface of the separation structure has a profile protruding in the first direction at a level lower than a top surface of the active pattern.

14. A semiconductor device, comprising:
a substrate comprising an active pattern extending in a first direction parallel to a bottom surface of the substrate;
a gate electrode extending in a second direction to cross the active pattern, the second direction parallel to the bottom surface of the substrate and crossing the first direction;
a gate capping pattern covering a top surface of the gate electrode; and
a separation structure at a side of the gate electrode and extending in the second direction to penetrate the active pattern in a third direction perpendicular to the bottom surface of the substrate, wherein the gate capping pattern comprises a material having a polishing selectivity with respect to the separation structure, a middle portion of the separation structure has a bulge having a width in the first direction greater than a width at a top portion of the separation structure, and the bulge is at a level below a top surface of the active pattern.

15. The semiconductor device of claim 14, further comprising:

a separation capping pattern covering a top surface of the separation structure, wherein a first width of the top surface of the separation structure in the first direction is less than a second width of a bottom surface of the separation capping pattern in the first direction.

16. The semiconductor device of claim 14, wherein the separation structure comprises a filling pattern penetrating the active pattern in the third direction, and a vertical insulating pattern interposed between the filling pattern and the gate electrode.

17. The semiconductor device of claim 16, wherein at least one of the filling pattern and the vertical insulating pattern comprises a material having a dielectric constant lower than that of the gate capping pattern.

18. The semiconductor device of claim 16, wherein the gate capping pattern comprises a material having a polishing selectivity with respect to at least one of the filling pattern and the vertical insulating pattern.

19. A semiconductor device, comprising:

a substrate comprising an active pattern extending in a first direction parallel to a bottom surface of the substrate;

a gate electrode extending in a second direction to cross the active pattern, the second direction parallel to the bottom surface of the substrate and crossing the first direction;

a gate capping pattern covering a top surface of the gate electrode;

a separation structure at a side of the gate electrode and extending in the second direction to penetrate the active pattern in a third direction perpendicular to the bottom surface of the substrate; and a separation capping pattern covering a top surface of the separation structure, wherein a first width of the top surface of the separation structure in the first direction is less than a second width of a bottom surface of the separation capping pattern in the first direction, a middle portion of the separation structure has a bulge having a width in the first direction greater than a width at a top portion of the separation structure, and the bulge is at a level below a top surface of the active pattern.

20. The semiconductor device of claim 19, wherein the separation structure comprises the same materials as the separation capping pattern.

* * * * *